(12) United States Patent
Saitoh et al.

(10) Patent No.: US 10,854,756 B2
(45) Date of Patent: Dec. 1, 2020

(54) ACTIVE MATRIX SUBSTRATE AND DEMULTIPLEXER CIRCUIT

(71) Applicant: Sharp Kabushiki Kaisha, Sakai (JP)

(72) Inventors: Yuhichi Saitoh, Sakai (JP); Hiroaki Furukawa, Sakai (JP); Tomohisa Aoki, Sakai (JP); Atsushi Hachiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 91 days.

(21) Appl. No.: 16/290,054

(22) Filed: Mar. 1, 2019

(65) Prior Publication Data
US 2019/0273167 A1 Sep. 5, 2019

(30) Foreign Application Priority Data
Mar. 2, 2018 (JP) .................. 2018-037154

(51) Int. Cl.
| H01L 29/786 | (2006.01) |
| H01L 29/51 | (2006.01) |
| H01L 29/66 | (2006.01) |
| H01L 21/02 | (2006.01) |
| H01L 27/12 | (2006.01) |

(52) U.S. Cl.
CPC .. *H01L 29/78696* (2013.01); *H01L 21/02123* (2013.01); *H01L 27/124* (2013.01); *H01L 29/511* (2013.01); *H01L 29/66969* (2013.01); *H01L 29/7869* (2013.01)

(58) Field of Classification Search
CPC ................................................... H01L 29/786
See application file for complete search history.

(56) References Cited

U.S. PATENT DOCUMENTS

| 2008/0225024 A1 | 9/2008 | Ito |
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |

FOREIGN PATENT DOCUMENTS

| JP | 2006-119404 A | 5/2006 |
| JP | 2008-225036 A | 9/2008 |
| JP | 2012-134475 A | 7/2012 |
| JP | 2014-007399 A | 1/2014 |
| JP | 2014-209727 A | 11/2014 |
| WO | 2011/118079 A1 | 9/2011 |

*Primary Examiner* — Marvin Payen
(74) *Attorney, Agent, or Firm* — Keating & Bennett, LLP

(57) ABSTRACT

An active matrix substrate includes a demultiplexer circuit which includes multiple TFTs. Each TFT includes a gate electrode, an oxide semiconductor layer that includes a source contact area, a drain contact area, and an area between a source and a drain that includes a channel region, a channel protection layer that covers only a portion of the area between the source and the drain, a source electrode that is brought into contact with the source contact area, and a drain electrode that is brought into contact with the drain contact area. At a cross-section in a channel length direction, of each TFT, an end portion facing toward the channel region, of one of the source and drain electrodes is brought into contact with the channel protection layer, and an end portion facing toward the channel region, of the other is positioned at a distance away from the channel protection layer.

18 Claims, 18 Drawing Sheets

ACTIVE MATRIX SUBSTRATE AND DEMULTIPLEXER CIRCUIT

BACKGROUND

1. Field

The present disclosure relates to an active matrix substrate that includes a demultiplexer circuit, and a demultiplexer circuit.

2. Description of the Related Art

An active matrix substrate that is used in a liquid display device or the like has a display area that has multiple pixels and an area (a non-display area or a frame area) other than the display area. Multiple pixels are arranged in a two-dimensional manner in a row direction and in a column direction in the display area. Each pixel includes a switching element such as a Thin Film Transistor (hereinafter referred to as "TFT"). As such a switching element, a TFT (hereinafter referred to as "amorphous silicon TFT") of which an activation layer is an amorphous silicon film, or a TFT (hereinafter referred to as "polycrystalline silicon TFT") of which an activation layer is a polycrystalline silicon film has been widely used in the related art.

It has been proposed that instead of amorphous silicon or polycrystalline silicon, an oxide semiconductor is used as a material of the activation layer of the TFT. Such a TFT is referred to as "oxide semiconductor TFT". The oxide semiconductor has higher mobility than the amorphous silicon. For this reason, it is possible that the oxide semiconductor TFT operates at a higher speed than the amorphous silicon TFT.

In some cases, a peripheral circuit such as a drive circuit is monolithically (integrally) formed in a non-display area of the active matrix substrate. By monolithically forming the dive circuit, narrowing-down of the non-display area or cost reduction that results from simplifying a mounting process is realized. For example, in some cases, in the non-display area, a gate driver circuit is monolithically formed, and a source driver circuit is mounted using Chip on Glass (COG).

It is proposed that in a device, such as a smartphone, narrowing-down of which frame is highly desirable, in addition to the gate driver, a demultiplexer circuit such as a source switch (source shared driving (SSD)) circuit is monolithically formed (for example, International Publication No. 2011/118079). The SSD circuit is a circuit that distributes video data from one video signal line that runs from each terminal of the source driver, to multiple source bus lines. By mounting the SSD circuit, an area (a terminal-portion formation area) in which a terminal portion is formed, of the non-display area can be further narrowed. Furthermore, the number of outputs from the source driver can be reduced, and a circuit scale can be decreased. Because of this, the cost of a driver IC can be reduced.

A peripheral circuit such as the drive circuit or the SSD circuit includes a TFT. In the present specification, a TFT that is positioned as a switching element in each pixel in the display area is referred to as "pixel TFT" and a TFT that constitutes the peripheral circuit is referred to as "circuit TFT". Furthermore, among circuit TFTs, a TFT that is used as the switching element in the demultiplexer circuit (or the SSD circuit) is referred to as "DMX circuit TFT" (or "SSD circuit TFT"). From the perspective of a manufacturing process, it is desirable that, in an active matrix substrate that uses an oxide semiconductor TFT as the pixel TFT, an oxide semiconductor TFT that uses the same oxide semiconductor film as the pixel TFT is formed as the circuit TFT.

Because a comparatively large amount of electric current flows in the DMX circuit TFT such as the SSD circuit TFT, it is desirable that a channel length L of the DMX circuit TFT is decreased and that a channel width W is increased. In particular, due to the high definition of the display device, the DMX circuit TFT is formed in a narrower area (for example, a distance between the source bus lines) in some cases, and it is desirable that a channel length L of the DMX circuit TFT is further reduced.

However, the research by the present inventor is that, in a case where the oxide semiconductor TFT is used as the DMX circuit TFT, in some cases, the channel length L is difficult to further reduce while ensuring the reliability of the oxide semiconductor TFT. The detail of this will be described below.

It is desirable to provide an active matrix substrate that includes a demultiplexer circuit having an oxide semiconductor TFT capable of reducing a channel length.

SUMMARY

According to an aspect of the disclosure, there is provided an active matrix substrate including a display area including multiple pixels, a non-display area provided in a vicinity of the display area, a substrate, a demultiplexer circuit positioned on the non-display area and supported on the substrate, multiple source bus lines extending in a first direction in the display area, and multiple gate bus lines extending in a second direction that intersects the first direction, in the display area, in which the demultiplexer circuit includes multiple TFTs and is connected to the multiple source bus lines, in which each of the multiple TFTs includes a gate electrode, an oxide semiconductor layer positioned in such a manner as to face the gate electrode with a gate insulation layer in between, the oxide semiconductor layer including a source contact area, a drain contact area, and an area between a source and a drain, which is positioned between the source contact area and the drain contact area and includes a channel region, a channel protection layer that covers only a portion of the area between the source and the drain, of the oxide semiconductor layer, a source electrode that is brought into contact with the source contact area of the oxide semiconductor layer, and a drain electrode that is brought into contact with the drain contact area of the oxide semiconductor layer, and in which, at a certain cross-section in a channel length direction, of each of the multiple TFTs, an end portion facing toward the channel region, of one electrode of the source electrode and the drain electrode is brought into contact with the channel protection layer, and an end portion facing toward the channel region, of another electrode is positioned at a distance away from the channel protection layer.

According to another aspect of the disclosure, there is provided a method of manufacturing any one of the active matrix substrates described above, the method including: forming the oxide semiconductor layer, and the channel protection layer that covers a portion of the oxide semiconductor layer; forming a conductive film that covers the oxide semiconductor layer and the channel protection layer, the conductive film having a projecting portion that reflects a shape of the channel protection layer; forming a mask on the conductive film; and obtaining the source electrode and the drain electrode by performing etching of the conductive film using the mask, in which the forming of the mask on the conductive film includes forming a resist film on the conductive film, a portion that is positioned on the projecting portion of the conductive film, of the resist film being thinner than any other portions, and obtaining the mask having an opening portion, by exposing the resist film using a photomask, subsequently performing development, and removing a portion that is defined by the photomask, of the resist film, the mask for aligning a portion of a contour of the opening portion to an edge portion of the channel protection layer when viewed from a direction normal to the substrate being formed by also removing a portion that is not defined by the photomask, of a portion that is positioned on the projecting portion of the resist film.

According to still another aspect of the disclosure, there is provided a method of manufacturing an active matrix substrate including multiple TFTs, the method including: forming an oxide semiconductor TFT in each of areas in which the multiple TFTs, respectively, are to be formed, in which the forming of the oxide semiconductor TFT includes forming an oxide semiconductor layer in each of the areas in which the multiple TFTs, respectively, are to be formed, forming a channel protection layer that covers only a portion of the oxide semiconductor layer, forming a conductive film that covers the oxide semiconductor layer and the channel protection layer, the conductive film having a projecting portion that reflects a shape of the channel protection layer, forming a mask on the conductive film, and obtaining a source electrode and a drain electrode by performing etching of the conductive film using the mask, in which the forming of the mask on the conductive film includes forming a resist film on the conductive film, a portion that is positioned on the projecting portion of the conductive film, of the resist film being thinner than any other portions, and obtaining the mask having an opening portion, by exposing the resist film using a photomask, subsequently performing development, and removing a portion that is defined by the photomask, of the resist film, the mask for aligning a portion of a contour of the opening portion to an edge portion of the channel protection layer when viewed from a direction normal to the substrate being formed by also removing a portion that is not defined by the photomask, of a portion that is positioned on the projecting portion of the resist film.

According to still another aspect of the disclosure, there is provided a demultiplexer circuit including multiple TFTs, in which each of the multiple TFTs includes a gate electrode, an oxide semiconductor layer positioned in such a manner as to face the gate electrode with a gate insulation layer in between, the oxide semiconductor layer including a source contact area, a drain contact area, and an area between a source and a drain, which is positioned between the source contact area and the drain contact area and includes a channel region, a channel protection layer that covers only a portion of the area between the source and the drain, of the oxide semiconductor layer, a source electrode that is brought into contact with the source contact area of the oxide semiconductor layer, and a drain electrode that is brought into contact with the drain contact area of the oxide semiconductor layer, and in which, at a certain cross-section in a channel length direction, of each of the multiple TFTs, an end portion facing toward the channel region, of one electrode of the source electrode and the drain electrode is brought into contact with the channel protection layer, and an end portion facing toward the channel region, of another electrode is positioned at a distance away from the channel protection layer.

DESCRIPTION OF THE EMBODIMENTS

In order to realize the high definition of an active matrix substrate, it is preferable that a source metal layer which includes a source bus line is formed using a conductive film that is possibly processed by dry etching with high precision. As this conductive film (hereinafter referred to as "source conductive film"), for example, an Al (aluminum) film is used. For the purpose of suppressing diffusion of Al and so on, in some cases, a multi-layered film (for example, a Ti/Al/Ti film) that is made up of an Al film and a Ti (titanium) film is used.

In most cases, source and drain electrodes of a pixel TFT and a circuit TFT are also formed using the source conductive film. For example, a source conductive film (for example, a Ti/Al/Ti film) is formed in such a manner as to cover an oxide semiconductor layer that is an activation layer of an oxide semiconductor TFT, and dry etching (for example, dry etching that uses chlorine) of the source conductive film is formed. Thus, the source and drain electrodes are obtained.

As a result of the research by the present inventor, it was found that, when the source and drain electrodes of the oxide semiconductor TFT were formed using the method described, there was a likelihood that corrosion (or after-collision) would occur due to a product material that resulted when the dry etching was performed. This can be a cause of a characteristic defect of the oxide semiconductor TFT. In particular, in a DMX circuit TFT having a large channel width, an area of a portion that is brought into contact with the product material described above, of the oxide semiconductor layer increases. Because of this, it is easy for the characteristic defect to occur due to the corrosion.

The reason why the corrosion occurs will be described in detail below.

Figure 16A:
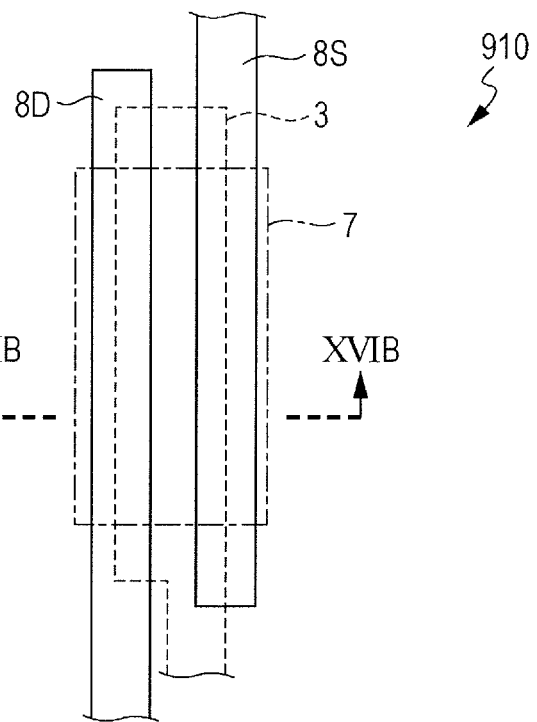
FIGS. 16A and 16B are a plan view and a cross-sectional view, respectively, that illustrate a channel etch type oxide semiconductor TFT that is the first reference example.
Figure 16B:
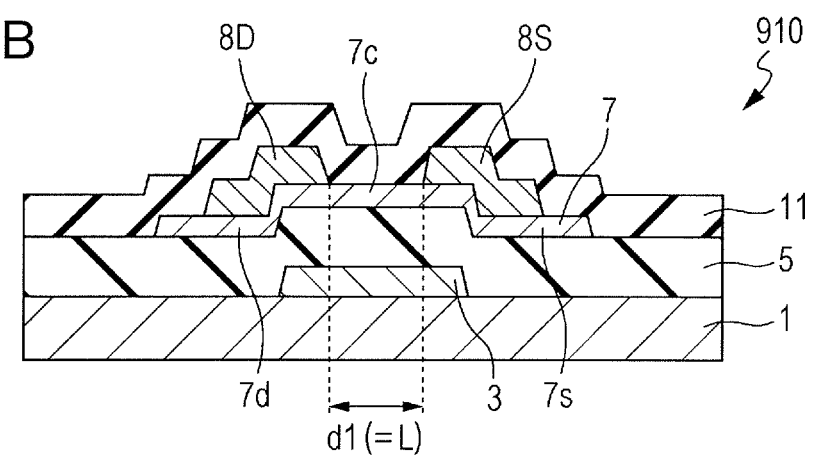
Figure 16C:
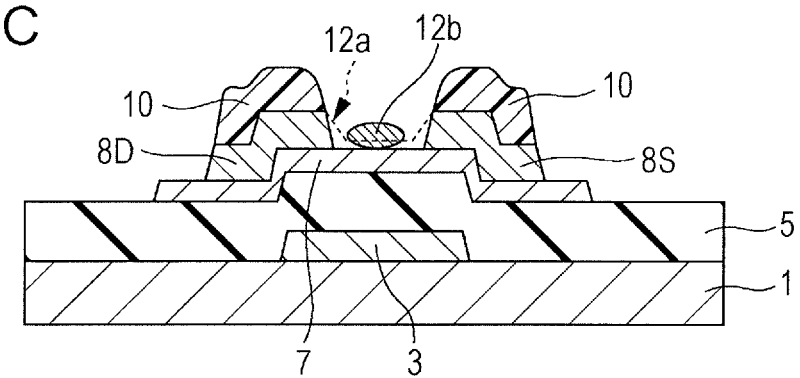
FIG. 16C is a cross-sectional view for describing a process of manufacturing the oxide semiconductor TFT.

FIGS. 16A and 16B are a plan view and a cross-sectional view, respectively, of an oxide semiconductor TFT (hereinafter referred to as "TFT") 910 that is a first reference example. FIG. 16C is a cross-sectional view for describing a process of manufacturing the oxide semiconductor TFT 910.

The TFT 910 has a gate electrode 3 that is supported on a substrate 1, a gate insulation layer 5 that covers a gate electrode 3, an oxide semiconductor layer 7 that is positioned on the gate insulation layer 5, and a source electrode 8S and a drain electrode 8D. Each of the source electrode 8S and the drain electrode 8D is connected directly to the oxide semiconductor layer 7. In the TFT 910, a portion that is positioned between the source electrode 8S and the drain electrode 8D, of the oxide semiconductor layer 7 is a channel region 7c. The channel region 7c is connected directly to an inorganic insulation layer (a passivation film) 11 that covers the TFT 910.

In the TFT 910, a length (a channel length) L in a direction in which electric current flows, of the channel region 7c is equal to a length d1 (hereinafter referred to as "inter-electrode distance d1") that is a distance between the source electrode 8S and the drain electrode 8D (L=d1). The inter-electrode distance d1 may be, for example, approximately 3 μm, depending on the process precision.

The TFT 910 is manufactured as follows. First, the gate insulation layer 5 that covers the gate electrode 3 and the gate electrode 3 is formed on the substrate 1, and the oxide semiconductor layer 7 is formed on the gate insulation layer 5. Subsequently, a source conductive film (for example, a Ti/Al/Ti film) is formed in such a manner as to cover the oxide semiconductor layer 7. Thereafter, as illustrated in FIG. 16C, a resist film 10 is formed on the source conductive film, and the dry etching of the source conductive film is performed with the resist film 10 an etching mask. At this time, in order to obtain a high-definition pattern suitable for the DMX circuit TFT, it is preferable that the dry etching is performed using etching gas that contains chlorine or a chlorine compound (boron trichloride or the like). Accordingly, the source electrode 8S and the drain electrode 8D are obtained from the source conductive film (a source and drain separation process). At this time, by the dry etching of the source conductive film, a portion (a portion that is a channel region) of a surface of the oxide semiconductor layer 7 is exposed. For this reason, a product material 12a that occurs by the dry etching adheres to the exposed surface of the oxide semiconductor layer 7. Because the product material 12a contains chlorine that is derived from the etching gas, thereafter, when the substrate 1 is transported in the atmosphere, in some cases, the product material 12a reacts with water in the atmosphere and generates chlorine. When the chlorine is generated, in addition to corrosion of an aluminum portion, which is known in the related art, it is understood that corrosion also occurs in an oxide semiconductor. The oxide semiconductor is dissolved in chlorine in the same manner as aluminum, and corrosion 12b can occur in the oxide semiconductor layer 7. The corrosion 12b in the oxide semiconductor layer 7 is a cause of the occurrence of a characteristic defect (for example, a leak defect) of the oxide semiconductor TFT 910.

It is noted that an example of a case where the source conductive film that contains Al is used is described above, but that it was observed that, even if the source conductive film contains Cu, in a case where the product material 12a contains chlorine, damage, such as corrosion, occurred to the surface of the oxide semiconductor layer.

In contrast to this, as a result of the further research by the present inventor, it was understood that a protection layer (a channel protection layer) having a prescribed thickness is provided on a portion that is the channel region, of the oxide semiconductor layer and thus that the occurrence of the corrosion of the oxide semiconductor layer could be suppressed. It is noted that a TFT structure that has the channel protection layer between the source and drain electrodes, and the oxide semiconductor layer is referred to as "channel protection type" or "etch stop type" and a TFT structure (FIGS. 16A to 16C) that does not have the channel protection layer is referred to as "channel etch type".

Figure 17A:
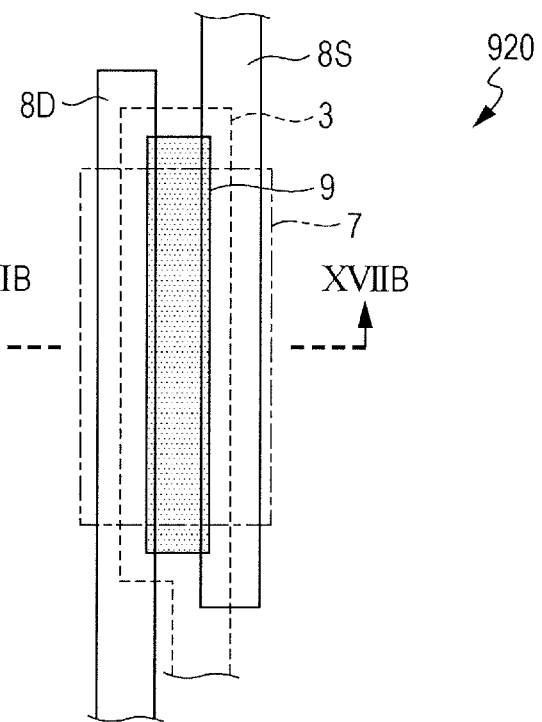
FIGS. 17A and 17B are a plan view and a cross-sectional view, respectively, that illustrate an etch stop type oxide semiconductor TFT that is a second reference example.
Figure 17B:
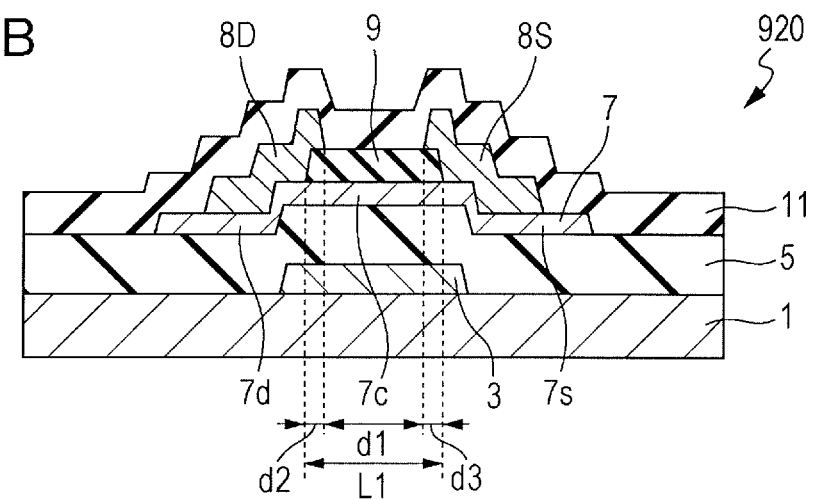
Figure 17C:
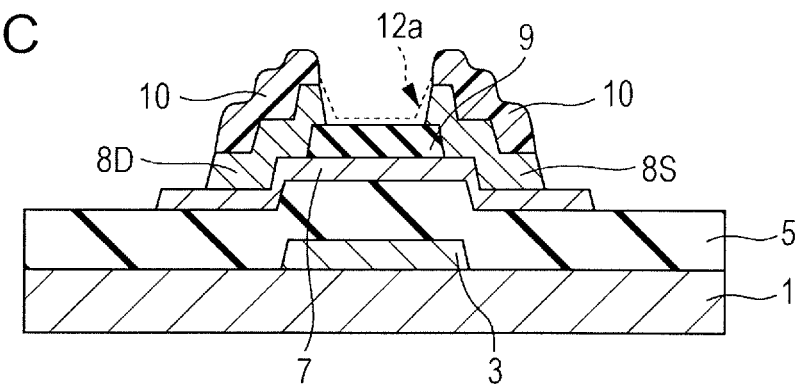
FIG. 17C is a cross-sectional view for describing a process of manufacturing the oxide semiconductor TFT.

FIGS. 17A and 17B are a plan view and a cross-sectional view, respectively, of an oxide semiconductor TFT 920 that is a second reference example. FIG. 17C is a cross-sectional view for describing a process of manufacturing the oxide semiconductor TFT 920.

The TFT 920 is an etch stop type TFT. The TFT 920 is different from the TFT 910 (a channel etch type TFT) that is the first reference example, in that a channel protection layer 9 is present between the oxide semiconductor layer 7 and each of the source electrode 8S and the drain electrode 8D. In the TFT 920, a portion of the oxide semiconductor layer 7, which is positioned between an area 7s that is brought into contact with the source electrode 8S and an area 7d that is brought into contact with the drain electrode 8D, is also the channel region 7c. The channel region 7c is covered with the channel protection layer 9. The channel protection layer 9 is an insulation layer that is, for example, a silicon oxide layer or the like.

In the TFT 920, a width in a channel length direction, of the channel protection layer 9 is designed in such a manner that the width is set to be greater than the inter-electrode distance d1, in order that a portion that is the channel region, of the oxide semiconductor layer 7 is not exposed in the source and drain separation process. For this reason, end portions facing toward the channel region, of the source electrode 8S and the drain electrode 8D are arranged in such a manner as to overlap the channel protection layer 9. A length d2 in the channel length direction, of each of the overlapping portions of the drain electrode 8D and the channel protection layer 9, and a length d3 in the channel length direction, of overlapping portions of the source electrode 8S and the channel protection layer 9 is determined considering an inter-layer alignment margin between the channel protection layer 9 and each of the source electrode 8S and the drain electrode 8D.

When manufacturing the TFT 920, the oxide semiconductor layer 7 is formed and then the channel protection layer 9 is provided on a portion (a portion that is the channel region) of the oxide semiconductor layer 7. Subsequently, the source conductive film is formed in such a manner as to cover the oxide semiconductor layer 7 and the channel protection layer 9. Thereafter, as illustrated in FIG. 17C, the source conductive film is patterned with the resist film 10 as a mask, and thus the source electrode 8S and the drain electrode 8D (the source and drain separation process). In this example, a portion that is positioned between the source electrode 8S and the drain electrode 8D, of the oxide semiconductor layer 7 is covered with the channel protection layer 9, and because of this, the surface of the oxide semiconductor layer 7 is not exposed. For this reason, the product material 12a that results from the dry etching adheres to a surface of the channel protection layer 9 is not brought into contact with the oxide semiconductor layer 7. Therefore, the occurrence of the corrosion of the oxide semiconductor layer 7 can be suppressed.

However, a channel length L is difficult to reduce in the etch stop type TFT 920. The channel length L of the TFT 920 is a length that results from adding the length d2 of each of the overlapping portions of the source electrode 8S and the channel protection layer 9, and the length d3 of the overlapping portions of the drain electrode 8D and the channel protection layer 9, to the inter-electrode distance d1 (L=d1+d2+d3). Therefore, the channel length L of the TFT 920 is set to be greater by a length (d2+d3) than the length L (=d1) of the channel etch type TFT 910 described above (FIGS. 16A to 16C).

Thus, the present inventor found a novel TFT structure in which while suppressing the occurrence of the characteristic defect of the oxide semiconductor TFT due to the corrosion, the channel L is reduced much more than in an etch stop type TFT in the related art, and contemplated the disclosure in the present application.

First Embodiment

An active matrix substrate according to a first embodiment will be described below with reference to the drawings. In the following, as an example, an active matrix substrate in which a demultiplexer circuit (an SSD circuit) and a gate driver are monolithically formed and a source driver is mounted will be described below. It is noted that in the active matrix substrate according to the present embodiment, at least the SSD circuit may be monolithically formed.

Structure of the Active Matrix Substrate

Figure 1:
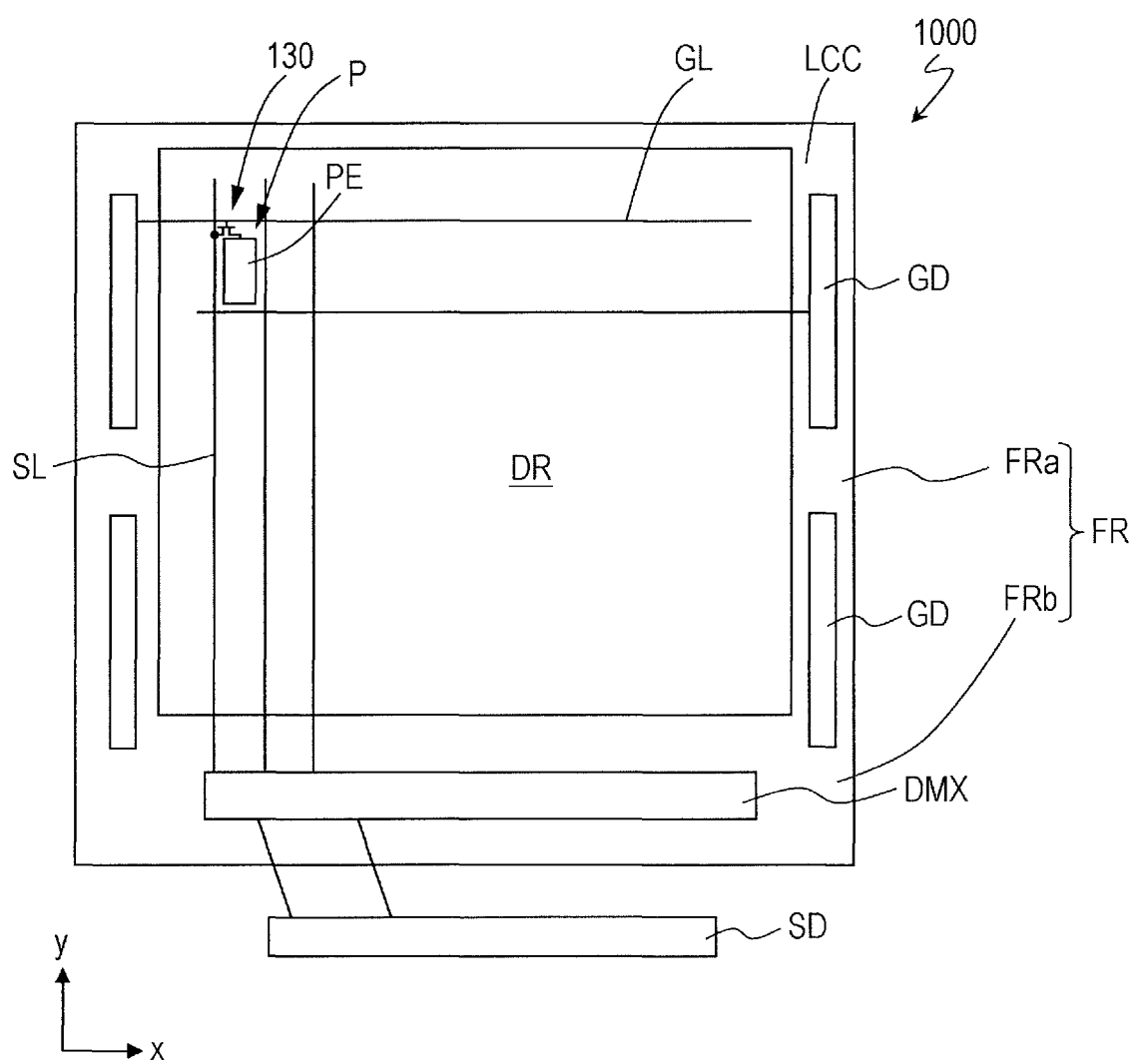
FIG. 1 is a schematic diagram illustrating an example of a planar structure of an active matrix substrate according to a first embodiment.

FIG. 1 is a schematic diagram illustrating an example of a planar structure of an active matrix substrate 1000 according to the present embodiment.

The active matrix substrate 1000 has a display area DR and an area (a non-display area or a frame area) FR other than the display area DR. The display area DR is configured with pixel areas P that are arranged in matrix form. The pixel area P (which, in some cases, is also referred to simply as "pixel") is an area that corresponds to a pixel of a display device. The non-display area FR is an area that is positioned in the vicinity of the display area DR and does not contribute to display.

The non-display area FR includes a terminal-portion formation area in which a terminal portion is formed, a drive circuit formation area in which a drive circuit is integrally (monolithically) formed, and the like. For example, a gate driver GD, a demultiplexer circuit DMX, and the like are monolithically provided in the drive circuit formation area.

A source driver SD, for example, is mounted in the active matrix substrate 1000. In an example that is illustrated, the gate driver GD is positioned in an area FRa that, for positioning, is interposed between both the sides of the display area DR, the source driver SD is mounted in an area FRb that is positioned under the display area DR. The demultiplexer circuit DMX is positioned between the non-display area FR and the source driver SD in the area FRb, and functions as the SSD circuit.

Multiple gate bus lines GL that extend in the row direction (the x direction) and multiple source bus lines SL that extends in the column direction (the y direction) are formed in the display area DR. Each pixel area P, for example, is defined by the gate bus line GL and the source bus line SL. Each of the gate bus lines GL is connected to each terminal of the gate driver GD. Each of the source bus line SL is connected to each terminal of the source driver SD.

Each pixel area P has a TFT (hereinafter referred to as "pixel TFT") 130 and a pixel electrode PE. A gate electrode of the pixel TFT 130 is electrically connected to the corresponding gate bus line GL, a source electrode thereof is electrically connected to the corresponding source bus line SL. A drain electrode is electrically connected to the pixel electrode PE. In a case where the active matrix substrate 1000 finds application in display devices that operate in a transverse electric field mode such as a Fringe Field Switching (FFS) mode, although not illustrated, an electrode (a common electrode) that is common to multiple pixels are provided in the active matrix substrate 1000.

Configuration of the Demultiplexer Circuit DMX

Figure 2:
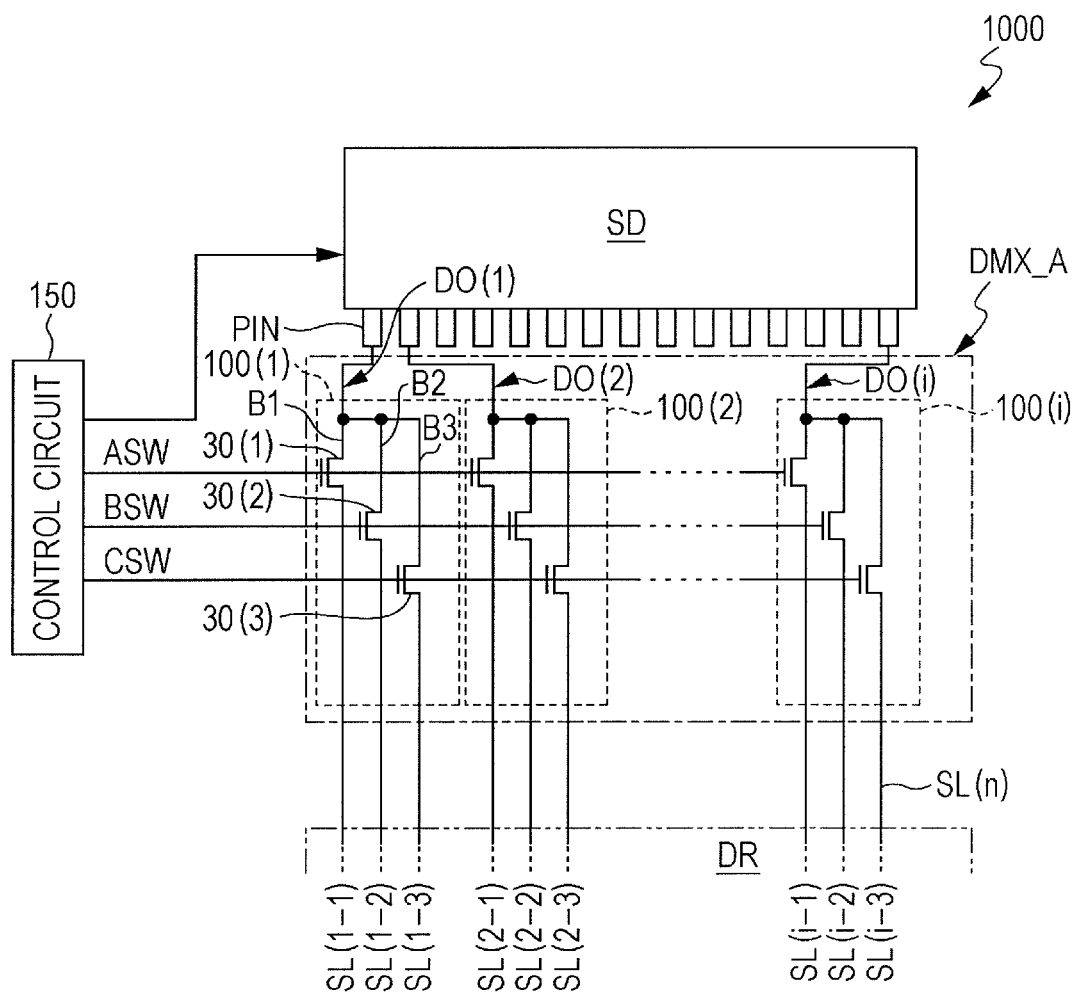
FIG. 2 is a diagram illustrating a demultiplexer circuit in the active matrix substrate according to the first embodiment.

FIG. 2 is a diagram for describing a configuration and operation of a demultiplexer circuit DMX_A in the active matrix substrate 1000 according to the present embodiment.

The demultiplexer circuit DMX_A is positioned between the source driver SD and the display area DR.

The demultiplexer circuit DMX_A includes multiple unit circuits, unit circuits 100(1) to 100(i) (i is an integer that is equal to or greater than 2) (which, in some cases, are hereinafter collectively referred to as "unit circuit 100"), and n (here, 3) control signal trunk lines, control signal trunk lines ASW to CSW. The control signal trunk lines ASW to CSW are connected to a control circuit 150.

Connected to each of the output pins PIN of the source driver SD is any one of multiple video signal lines, video signal lines DO (1) to DO (i) (which, in some cases, are collectively referred to as "video signal line DO"). Associated with one video signal line DO, n (here, 3) (n is an integer that is equal to or greater than 2) source bus lines SL in a group. The unit circuit 100 is provided on a per-video signal line basis between the video signal line DO and the source bus lines SL in a group. The unit circuit 100 distributes video data from one video signal line DO to n source bus lines SL.

At this point, an N-th video signal line of the multiple video signal lines DO (1) to DO (i), and the unit circuit 100 and the source bus line SL is defined as DO(N) (N is an integer from 1 to i), and the unit circuit 100 and the source bus line SL that are associated with the video signal line DO(N) are defined as 100(N) and SL (N−1) to SL(N−n), respectively. The source bus lines SL(N−1) to SL (N−n), for example, may be associated with R, G, and B pixels, respectively (that is, n=3).

The unit circuit 100(N) includes n branch wiring lines, branch wiring lines B1 to Bn, that are connected to the video signal line DO(N), and n DMX TFTs, DMX TFTs 30(1) to 30(n) (which, in some cases, are hereinafter collectively referred to "TFT 30").

The TFT 30 functions as a selection switch. A gate electrode of the TFT 30 is electrically connected to the corresponding one of n control signal trunk lines, control signal trunk lines ASW, BSW, and CSW. A source electrode of the TFT 30 is electrically connected to the corresponding one of branch wiring lines B1 to Bn. A drain electrode of the TFT 30 is connected to the corresponding source bus line of the source bus lines SL(N−1) to SL(N−3).

A selection signal is supplied from one of the control signal trunk lines ASW to CSW to the gate electrode of the TFT 30. The selection signal defines an ON duration of the selection switch within the same group and is synchronized with a time-series signal output from the source driver SD. The unit circuit 100(N) writes (performs time-driving of) data electric potential that is obtained by time-dividing an output of the video signal line DO(N), to multiple source bus lines, the source bus line SL(N−1) to the source bus line SL(N−n) in a time-series manner. Accordingly, because the number of output pins PIN of the source driver SD can be reduced, an area of non-display area FR can be further reduced (frame-narrowing).

Figure 3A:
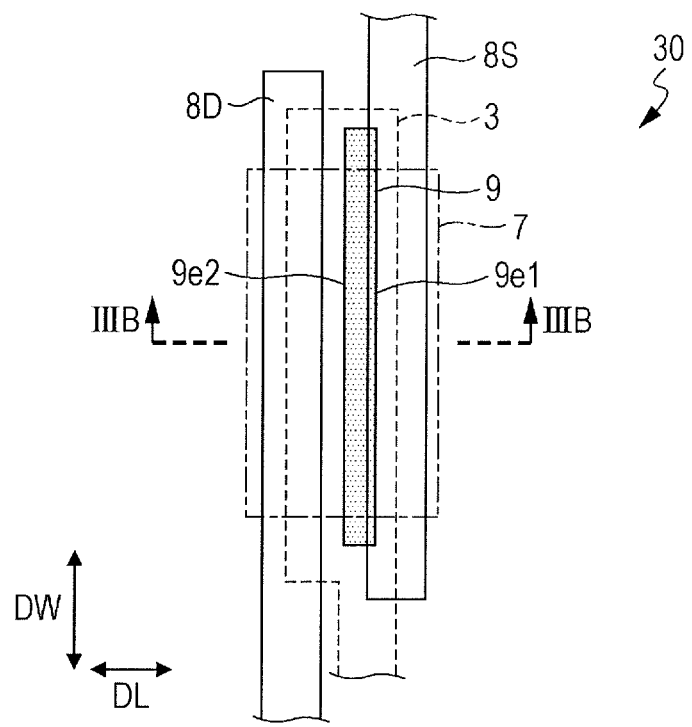
FIGS. 3A and 3B are a plan view and a cross-sectional view, respectively, that illustrate a DMX circuit TFT according to the first embodiment.
Figure 3B:
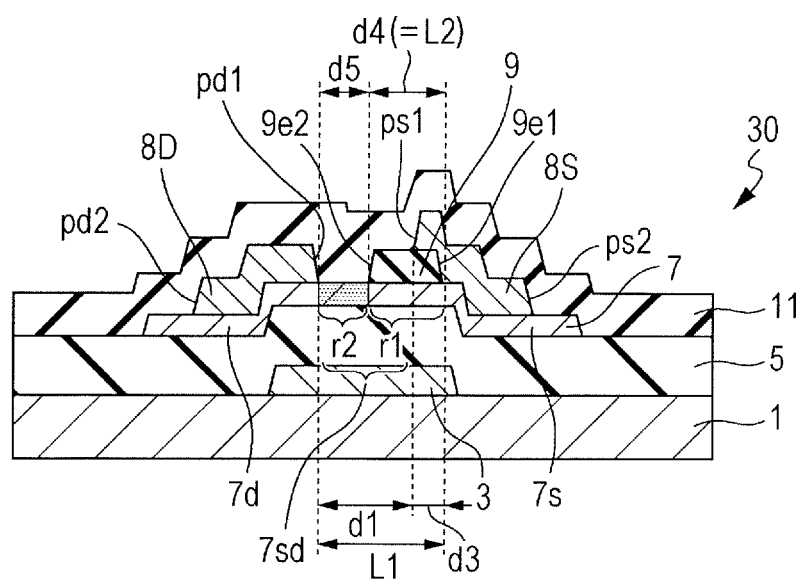

It is noted that operation of a display device that uses a demultiplexer circuit DMX, a timing chart of time division driving, and the like, for example, are disclosed in Japanese Unexamined Patent Application Publication Nos. 2008-225036 and 2006-119404, International Publication No. 2011/118079 and other publications. For reference, the entire contents of Japanese Unexamined Patent Application Publication Nos. 2008-225036 and 2006-119404, and International Publication No. 2011/118079 are incorporated in the present specification by reference. Structure of the DMX Circuit TFT FIGS. 3A and 3B are a plan view and a cross-sectional view, respectively, that illustrate a DMX circuit TFT 30. FIG. 3B illustrates a cross-section taken along line IIIB-IIIB in FIG. 3A.

The TFT 30 includes an etch stop type oxide semiconductor TFT that includes the oxide semiconductor layer 7 as the activation layer.

The TFT 30 is supported on the substrate 1, and has the gate electrode 3, the gate insulation layer 5, the oxide semiconductor layer 7, the channel protection layer 9, the source electrode 8S, and the drain electrode 8D. The oxide semiconductor layer 7 is positioned in such a manner as to face the gate electrode 3 with the gate insulation layer 5 in between. The channel protection layer 9 is positioned on a portion of the oxide semiconductor layer 7 in such a manner as to be brought into contact with an upper surface of the oxide semiconductor layer 7.

In this example, the gate electrode 3 is provided between the substrate 1 and the oxide semiconductor layer 7. More precisely, the TFT 30 has a bottom gate structure. The gate insulation layer 5 is positioned in such a manner as to cover the gate electrode 3. The oxide semiconductor layer 7 is positioned on the gate insulation layer 5.

The source electrode 8S is provided on the oxide semiconductor layer 7, and is brought into contact with a portion of the oxide semiconductor layer 7. The drain electrode 8D is provided on the oxide semiconductor layer 7 and is brought into contact with any other portion of the oxide semiconductor layer 7.

In the present specification, a portion that is brought into contact with the source electrode 8S, of the oxide semiconductor layer 7 is referred to as "source contact area 7s", and a portion that is brought into the drain electrode 8D is referred to as "drain contact area 7d".

Furthermore, an area that is positioned between the source contact area 7s and the drain contact area 7d when viewed from the direction normal to the substrate 1 is referred to as "between-S-and-D area 7sd". The between-S-and-D area 7sd includes the channel region. Furthermore, in a plane parallel to the substrate 1, a direction DL parallel to a direction in which electric current flows through the channel region is referred to as "channel length direction", and a direction DW that orthogonally intersects the channel length direction DL is referred to as "channel width direction". In the channel region, a length along the channel length direction DL is defined as the channel length L, and a length along a channel width direction DW is defined as a channel width W.

In the present embodiment, as illustrated in FIG. 3B, at a certain cross-section in the channel length direction DL of the TFT 30, an end portion facing toward the channel region, of one electrode of the source electrode 8S and the drain electrode 8D is brought into contact with the channel protection layer 9, and an end portion facing toward the channel region, of the other electrode is positioned at a distance away from the channel protection layer 9. In this example, an end portion ps1 facing toward the channel, of the source electrode 8S is brought into contact with the channel protection layer 9, and an end portion pd1 facing toward the channel, of the drain electrode 8D is positioned at a distance away from the channel protection layer 9. The end portion ps1 facing toward the channel region, of one electrode (here, the source electrode 8S) is positioned on an upper surface of the channel protection layer 9, and is brought into contact with the upper surface of the channel protection layer 9. More precisely, the channel protection layer 9 is positioned between the source electrode 8S and the oxide semiconductor layer 7, and the channel protection layer 9 and the source electrode 8S overlaps partially when viewed from the direction normal to the substrate 1. On the other hand, the end portion pd1 facing toward the channel region, of the other electrode (here, the drain electrode 8D) is brought into contact with the upper surface of the oxide semiconductor layer 7. It is noted that the end portion pd1 of the drain electrode 8D may be brought into contact with the channel protection layer 9 and that the end portion ps1 of the source electrode 8S may be positioned at a distance away from the channel protection layer 9.

The channel protection layer 9 covers only a portion of the between-S-and-D area 7sd. A portion that is covered with the channel protection layer 9, of the between-S-and-D area 7sd is referred to as "first portion r1", and a portion that is not covered with the channel protection layer 9 is referred to as "second portion r2". In this example, a portion that is positioned between the end portion pd1 of the drain electrode 8D and the channel protection layer 9 and is not brought into contact with any one of the drain electrode 8D and the channel protection layer 9 is the second portion r2. The second portion r2 of the between-S-and-D area 7sd may be a semiconductor area. In a case where the second portion r2 is the semiconductor area, the second portion r2 is a portion of the channel region. Alternatively, the second portion r2 may be a low-resistance area (or a conductor area) that has a lower electric resistance than the first portion r1. For example, resistance decreasing processing, such as plasma processing, is performed on the second portion r2, or an insulation film that reduces an oxide semiconductor is formed. Thus, the second portion r2 can be obtained.

The TFT 30 may be covered with a protection film (here, the inorganic insulation layer) 11. The inorganic insulation layer 11 is positioned in such a manner as to be brought into contact with surfaces of the source electrode 8S and the drain electrode 8D, a portion of the upper surface of the channel protection layer 9, and the second portion r2 of the oxide semiconductor layer 7.

According to the present embodiment, the source and drain separation process can be performed in a state where a portion of the between-S-and-D area 7sd is covered with the channel protection layer 9. Because of this, a rate of the occurrence of the corrosion due to the product material that results from the etching can be reduced much more than in the case of the channel etch type TFT (for example, the TFT 910 that is illustrated in FIGS. 16A and 16B).

Furthermore, according to the present embodiment, the channel length can be decreased much more than in the etch stop type TFT (for example, the TFT 920 that is illustrated in FIGS. 17A and 17B) in the related art. For example, in a case where the second portion r2 is the semiconductor area, the entire between-S-and-D area 7sd (the first portion r1 and the second portion r2) can be the channel region. The channel length (referred to as "first channel length") L1 in this case is a length that results from adding the length d3 of each of the overlapping portions, of the source electrode 8S and the channel protection layer 9, to the length (the inter-electrode distance) d1 between the source electrode 8S and the drain electrode 8D (L1=d1+d3). Therefore, the first channel length L1 can be set to be shorter than the channel length L(=d1+d2+d3) of the etch stop type TFT 920 that is illustrated in FIGS. 17A to 17C.

On the other hand, in a case where the second portion r2 is a low-resistance area, only the first portion r1 of the between-S-and-D area 7sd is the channel region. The channel length (referred to as "second channel length") L2 in this case is a length d4 in the channel length direction, of the first portion r1 (L2=d4<L1). Therefore, by decreasing the resistance of the second portion r2, further shortening of a channel can be realized.

It is noted that in the etch stop type TFT 920 that is illustrated in FIGS. 17A to 17C, a width in the channel length direction, of the channel protection layer 9 needs to be set to be greater than the inter-electrode distance d1. In contrast to this, in the present embodiment, the width (that is, the length d4 in the channel length direction, of the first portion r1) of the channel protection layer 9 can be set to be shorter than the inter-electrode distance d1. By decreasing the size of the length d4, the second channel length L2 (=d4) of the TFT 30 can be further reduced.

In this manner, according to the present embodiment, while controlling the characteristic defect of the oxide semiconductor TFT due to the corrosion to ensuring the high reliability, the DMX circuit TFT that has a shorter channel length than the etch stop type TFT in the related art.

The thickness of the channel protection layer 9, for example, may exceed half of the thickness of each of the source electrode 8S and the drain electrode 8D. Alternatively, the channel protection layer 9 may be set to be thicker than the source electrode 8S and the drain electrode 8D. By increasing the thickness of the channel protection layer 9, the corrosion of the oxide semiconductor layer 7 can be more effectively suppressed. Furthermore, in the source and drain separation process, it is possible that the source conductive film is patterned in a self-alignment manner using a stepped shape of the channel protection layer 9. When using a self-alignment process (which will be described below), the width (=d4) in the channel length direction, of the channel protection layer 9 needs to be increased considering the overlapping between each of the source electrode 8S and the drain electrode 8D and the channel protection layer 9. Because of this, the channel length can be further reduced.

In an example that is illustrated, the channel protection layer 9 is island-shaped, but the channel protection layer 9 may not be island-shaped. For example, the channel protection layer 9 may be positioned in such a manner as to cover the oxide semiconductor layer 7 and the gate insulation layer 5, and may have an opening portion in each of the portions that are at least the source contact area 7s and the drain contact area 7d.

Furthermore, for example, patterning of the channel protection layer 9 is performed using a multi-level gradation photomask, and thus the thickness of the channel protection layer 9 may be set to differ within a substrate surface. As an example, in a case where the etch stop type oxide semiconductor TFT is formed as the pixel TFT, the channel protection layer in the pixel TFT may be set to be thinner than the channel protection layer of the DMX circuit TFT. Accordingly, in the DMX circuit TFT, an attempt to shorten the channel can be made using the stepped shape of the channel protection layer 9, and in the pixel TFT, step-caused disconnection or the like of each of the source electrode 8S and the drain electrode 8D, which results from the stepped shape of the channel protection layer 9, can be suppressed. Because of this, an advantage is provided.

The TFT 30 may be provided in such a manner that in an area in the vicinity of the active matrix substrate, the channel width direction DW is a direction (the y direction in FIG. 1) in which the source bus line SL extends and that the channel length direction DL is a direction (the x direction in FIG. 1) in which the gate bus line GL extends. The source electrode 8S of the TFT 30 may be a portion of the source bus line SL.

The source electrode 8S and the drain electrode 8D may be provided in such a manner as to partially overlap the gate electrode 3 when viewed from the direction normal to the substrate 1. Lengths of the overlapping portions of each of the source electrode 8S and the drain electrode 8D and the gate electrode 3 can be set considering the precision of positioning. The source electrode 8S may extend crossing the oxide semiconductor layer 7 in the channel width direction DW, in such a manner as to overlap one of the edge portions of the gate electrode 3 when viewed from the direction normal to the substrate 1. In the same manner, the drain electrode 8D may extend crossing the oxide semiconductor layer 7 in the channel width direction DW, in the same manner as to overlap the other of the edge portions of the gate electrode 3.

Furthermore, an edge portion facing toward the channel region, of the source electrode 8S, and an edge portion that is opposite in direction to the edge portion may extend crossing the oxide semiconductor layer 7. In the same manner, an edge portion facing toward the channel region, of the drain electrode 8D, and an edge portion that is opposite in direction to the edge portion may extend crossing the oxide semiconductor layer 7. Accordingly, the width in the channel length direction, of the TFT 30 can be further decreased, and for example, the positioning by a distance between the source bus lines SL is possible.

The gate electrode 3 may extend crossing the oxide semiconductor layer 7 in approximately the channel width direction DW, when viewed from the direction normal to the substrate 1. The width in the channel length direction DL, of the gate electrode 3 may be set to be smaller than the width in the channel length direction DL, of the oxide semiconductor layer 7.

Method of Manufacturing the TFT 30

Figure 4A:
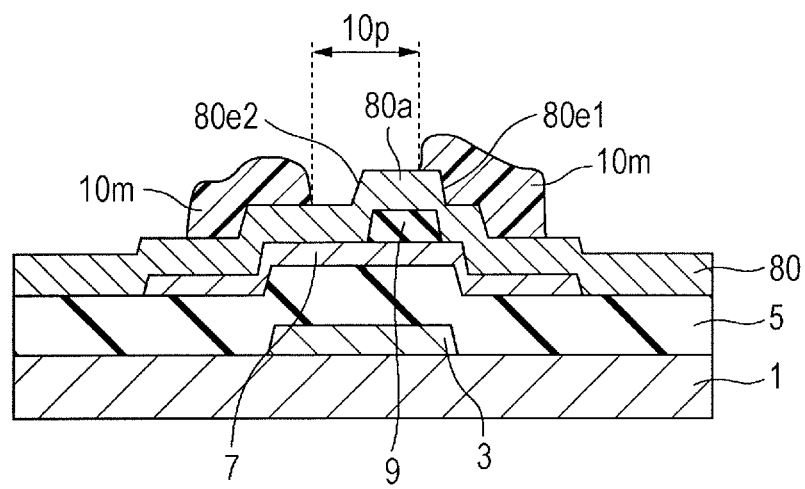
FIGS. 4A and 4B are cross-sectional views, each for describing an example of a method of manufacturing the DMX circuit TFT.

An example of a method of manufacturing the TFT 30 will be described below with reference to FIGS. 3A, 3B and 4A. FIG. 4A is a cross-sectional view for describing a process of forming the source electrode 8S and the drain electrode 8D in the method of manufacturing the TFT 30.

First, a gate electrode (the thickness: for example, 100 nm to 500 nm) 3 is formed on the substrate 1. Subsequently, a gate insulation layer (the thickness: for example, 300 nm to 400 nm) 5 is formed in such a manner as to cover the gate electrode 3.

As the substrate 1, for example, a glass substrate, a silicon substrate, a plastic substrate (a resin substrate) that has a heat-resisting property, or the like can be used.

For example, a conductive film is formed on the substrate 1 using a sputtering method or the like, and then the gate electrode 3 can be formed by patterning the conductive film using a known lithography. As the conductive film for forming the gate electrode 3, a film that contains a metal, such as aluminum (Al), tungsten (W), molybdenum (Mo), tantalum (Ta), chrome (Cr), titanium (Ti), copper (Cu), or gold (Au), an alloy of these, or a metal nitride of these can be suitably used. Furthermore, a multi-layered film that results from stacking these multiple films may be used.

For example, the gate insulation layer 5 can be formed at a temperature from 300° C. to 400° C., using a plasma CVD apparatus. As the gate insulation layer 5, a silicon oxide ($SiO_2$) layer, a silicon nitride (SiNx) layer, a silicon-oxide-nitride (SiOxNy; x>y) layer, a silicon nitride oxide (SiNxOy; x>y) layer, or the like can be suitably used. The gate insulation layer 5 may have a multi-layered structure. For example, the SiNX layer may be formed toward the substrate (the lower layer) in order to keep impurities or the like from being diffused from the substrate 1, and the $SiO_2$ layer may be formed on the above-described layer (the upper layer) to ensure the insulation.

Subsequently, an oxide semiconductor layer (the thickness thereof, for example, is equal to greater than 5 nm and is equal to or smaller than 100 nm) 7 is formed on the gate insulation layer 5. Specifically, first, an oxide semiconductor layer is formed at a temperature from 100 to 400° C. using a sputtering apparatus. Alternatively, the oxide semiconductor layer may be formed by a dispensing process. Subsequently, patterning of the oxide semiconductor layer is performed using a known photolithography, and the island-shaped the oxide semiconductor layer 7 is obtained. The oxide semiconductor layer 7 is positioned in such a manner as to overlap the gate electrode 3 with the gate insulation layer 5 in between.

Subsequently, a protection insulation film is formed in such a manner as to cover the oxide semiconductor layer 7. As the protection insulation film, for example, oxide films may be used such as SiOx films (which include a SiO2 film). The thickness of the protection insulation film is not particularly limited. However, in a case where the self-alignment process that will be described below is performed, it is preferable that for example, the thickness is equal to or greater than 200 nm and is equal to or smaller than 500 nm. In a case where the self-alignment process is not performed, for example, the thickness may be equal to or greater than 30 nm and be equal to or smaller than 300 nm.

Subsequently, patterning of the protection insulation film is performed, and the channel protection layer 9 is obtained that covers at least a part of a portion that is the channel region, of the oxide semiconductor layer 7. The width in the channel length direction DL, of the channel protection layer 9 is not particularly limited, but for example, may be equal to or greater than 1 mm or be equal to or smaller than 10 mm. In a case where the self-alignment process that will be described below is performed, the overlapping between each of the source and drain electrodes and the channel protection layer 9 may not be considered. Because of this, the width in the channel length direction DL, of the channel protection layer 9 can be further decreased (for example, is equal to or greater than 1 μm and is equal to or smaller than 2 μm).

Thereafter, the source electrode 8S and the drain electrode 8D are formed.

As illustrated in FIG. 4A, for example, a conductive film (a source conductive film) 80 is formed using the sputtering method, in such a manner as to cover the oxide semiconductor layer 7 and the channel protection layer 9. The source conductive film 80 has a projecting portion 80a that reflects a shape of the channel protection layer 9.

As the source conductive film 80, a film that contains a metal, such as aluminum (Al), tungsten (W), molybdenum (Mo), tantalum (Ta), copper (Cu), chrome (Cr), titanium (Ti), or gold (Au), an alloy of these, or a metal nitride of these can be suitably used. Furthermore, a multi-layered film that results from stacking these multiple films may be used. As the multi-layered film, a film may be used that results from stacking a Ti film, an Al film, and a Ti film in this order one on top of another. The thickness of the source conductive film 80, for example, may be equal to or greater than 200 nm and is equal to or smaller than 500 nm.

A lithography that uses a photosensitive resist material is used for patterning of the source conductive film 80.

First, as illustrated in FIG. 4A, using a known method, a resist film is formed on the entire substrate, and then exposing and developing of the resist film is performed, thereby forming a mask 10m. The mask 10m has an opening portion 10p for separating a source and a drain. In this example, in a cross-sectional structure that is illustrated, through the opening portion 10p, only a portion of the projecting portion 80a, and the mask 10m (a portion that does not have an opening, of the mask 10m) covers one flank surface 80e1 of the projecting portion 80a and does not cover the other flank surface 80e2 with a distance in between. A gap is formed between the mask 10m and the flank surface 80e2.

Thereafter, the patterning of the source conductive film 80 is performed using the obtained mask 10m. Accordingly, the source electrode 8S and the drain electrode 8D that is separated from the source electrode 8S are obtained (the source and drain separation process). In this example, the source electrode 8S is brought into contact with the channel protection layer 9, and the drain electrode 8D is positioned at a distance away from the channel protection layer 9. Although not illustrated, at the same time, a source bus line is also formed from the source conductive film 80.

The patterning of the source conductive film 80 may be performed by a photolithography that uses etching gas which contains chlorine or a chlorine compound (boron trichloride or the like). Although this is the case, within the opening portion 10p, a portion (a first portion) r1 of the oxide semiconductor layer 7 is covered with the channel protection layer 9 and is not brought into contact with the product material that results from the etching. Therefore, the occurrence of the corrosion of the oxide semiconductor layer 7 is suppressed. Subsequently to the patterning of the source conductive film 80, the resist film 10 is removed with stripping liquid. Thus, as illustrated in FIG. 4B, the source electrode 8S and the drain electrode 8D are formed.

Figure 4B:
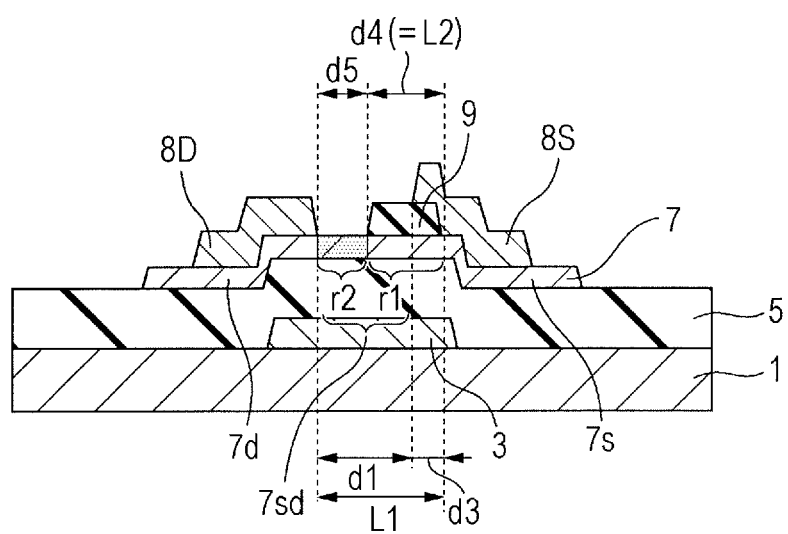

Within the between-S-and-D area 7sd that is illustrated in FIG. 4B, a length d5 in the channel length direction DL, of a portion (a second portion) r2 that is not covered with the channel protection layer 9, of the oxide semiconductor layer 7, for example, may be less than half of the inter-electrode distance d1. Accordingly, the occurrence of the corrosion can be more effectively suppressed.

Subsequently, in a state that is illustrated in FIG. 4B, plasma processing may be performed. For example, within the plasma CVD apparatus, processing may be performed that provides exposure to an atmosphere of plasma in which reducing gas (hydrogen gas, nitric monoxide, or the like) is used. By this processing, the oxygen defect occurs in a portion (the second portion) r2 that is exposed between the source electrode 8S, the channel protection layer 9, and the drain electrode 8D, of the oxide semiconductor layer 7, and thus a carrier electron occurs. Because of this, the second portion r2 can have more reduced electric resistance than the first portion r1. In this manner, the TFT 30 is obtained.

Subsequently, the inorganic insulation layer 11 is formed in such a manner as to cover the TFT 30. The thickness of the inorganic insulation layer 11, for example, is equal to or greater than 200 nm or is equal to or smaller than 500 nm. The inorganic insulation layer 11 can be formed at a temperature from 200° C. to 300° C. using the plasma CVD apparatus.

As the inorganic insulation layer 11, a silicon oxide ($SiO_2$) layer, a silicon nitride (SiNx) layer, a silicon-oxide-nitride (SiOxNy; x>y) layer, a silicon nitride oxide (SiNxOy; x>y) layer, or the like can be suitably used. The inorganic insulation layer 11 may have a multi-layered structure.

In a case where the second portion r2 of the oxide semiconductor layer 7 is set to be the semiconductor area (a portion of the channel region), for example, an oxide film layer such as $SiO_2$ may be used as the inorganic insulation layer 11 (a lower layer of the inorganic insulation layer 11, in a case where the inorganic insulation layer 11 has a multi-layered structure). Accordingly, in a case where the oxygen deficiency excessively occurs in the oxide semiconductor layer 7, it is also possible that oxygen which is contained in the oxide film layer makes up for the oxygen deficiency.

On the other hand, in a case where the second portion r2 of the oxide semiconductor layer 7 is used as a contactor area, for example, a reducing insulation layer that has a property of reducing the oxide semiconductor that is contained in the oxide semiconductor layer 7 may be used as the inorganic insulation layer 11 (the lower layer of the inorganic insulation layer 11, in the case where the inorganic insulation layer 11 has a multi-layered structure). Accordingly, the second portion r2 that is brought into direct contact with the inorganic insulation layer 11, of the oxide semiconductor layer 7 is a low electric resistance area of which the resistance is decreased. The first portion r1 that is covered with the channel protection layer 9 and thus is not brought into direct contact with the inorganic insulation layer 11, of a portion that is positioned between the source electrode 8S and the drain electrode 8D, of the oxide semiconductor layer 7 remains as a semiconductor area of which the resistance is not decreased. As the reducing insulation film, a silicon nitride (SiNx) film that contains hydrogen ($H_2$) or nitric monoxide (NO) in the silicon nitride itself, a silicon-oxide-nitride (SiNxOy; x>y) film, or the like can be used. It is noted that in a case where the reducing insulation film is used as the inorganic insulation layer 11, the resistance decreasing processing (the plasma processing), which is described above, may be performed.

It is noted that in the method described above, depending on the thickness of and a flank-surface taper shape of the channel protection layer 9, the thickness of the resist film 10, and the like, the patterning of the source electrode 8S and the drain electrode 8D can be performed using the self-alignment process. A description will be provided below with reference to FIGS. 4C and 4D.

Figure 4C:
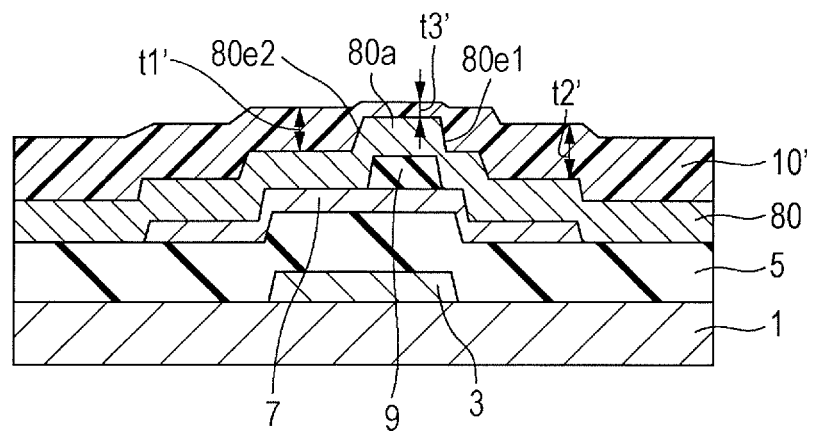
FIGS. 4C and 4D are cross-sectional views, each for describing another example of the method of manufacturing the DMX circuit TFT.

First, as illustrated in FIG. 4C, a resist film 10' is formed on the source conductive film 80. At this time, when the channel protection layer 9 is sufficiently thick, a thickness t3' of a portion (referred to as a thin film portion) that is positioned on an upper surface of the projecting portion 80a, of the resist film 10' is set to be smaller than thicknesses t1' and t2' of any other portions.

Figure 4D:
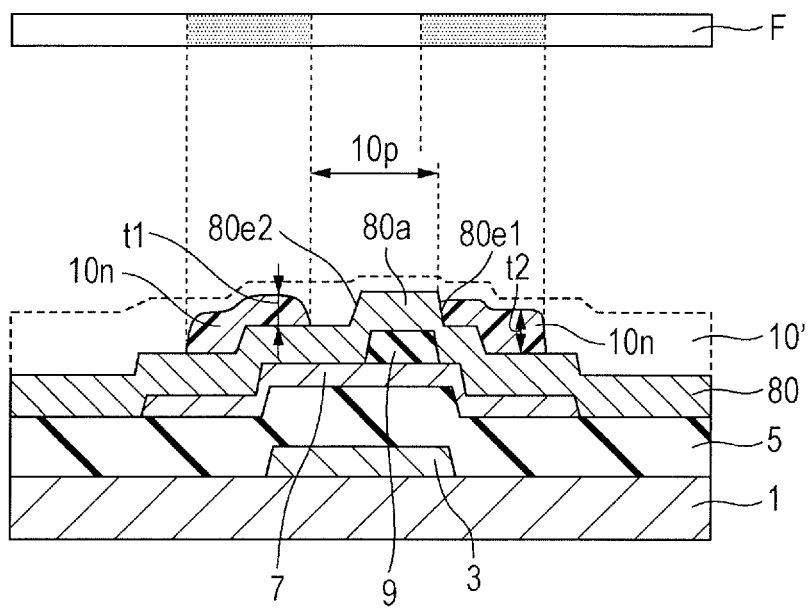

Subsequently, as illustrated in FIG. 4D, with a known method, a resist film (which is preferably manufactured using a positive type resist material) is exposed using a photomask F, development is subsequently performed, and a portion that is defined with the photomask F, of the resist film 10' is removed. Thus, a resist mask 10n that has the opening portion 10p is formed. At this point, when the resist film 10' is patterned by the exposure and the development, due to exposure of a non-exposure portion of the resist film 10' to stray light and development during the exposure, the thickness of the resist film 10' is reduced. An amount of the reduced film thickness is suitably adjusted. Thus, a thin portion of the resist film 10', that is, a thin film portion that is positioned on the upper surface of the projecting portion 80a is removed. For this reason, a part that is not defined with the photomask F, of the thin film portion is also removed. As a result, the opening portion 10p is positioned in such a manner that the upper surface of the projecting portion 80a is exposed along the channel length direction DL. More precisely, the opening portion 10p is set to be larger than an opening pattern that is defined with the photomask F. A portion of a contour of the opening portion 10p is aligned to an edge portion of the channel protection layer 9 when viewed from the direction normal to the substrate 1. Furthermore, the thickness of the mask 10n is, for example, t1 or t2, and the mask 10n (a portion that does not have an opening, of the mask 10n) is not positioned on the projecting portion 80a of the source conductive film 80 (does not sit on the projecting portion 80a). In this manner, the mask 10n that has the opening portion 10p can be formed in a self-alignment manner, using the projecting portion 80a that reflects a stepped shape of the channel protection layer 9.

In the present embodiment, it is preferable that the thickness of and the flank-surface taper shape of the flank surface of the channel protection layer 9, the thickness of the source conductive film 80, the thickness of the resist film, and the like are controlled in such a manner that the self-alignment process described above is realized. For example, the thickness of the channel protection layer 9 may be equal to or greater than half of the thickness of the source conductive film 80 (that is, the thickness of each of the source electrode 8S and the drain electrode 8D). Alternatively, the channel protection layer 9 may be thicker than the source conductive film 80. Furthermore, a taper angle in the flank surface taper shape of the channel protection layer 9 (an angle between a flank surface and a lower surface of the channel protection layer 9), for example, may be equal to or greater than 45° and be smaller than 90°.

Figure 5A:
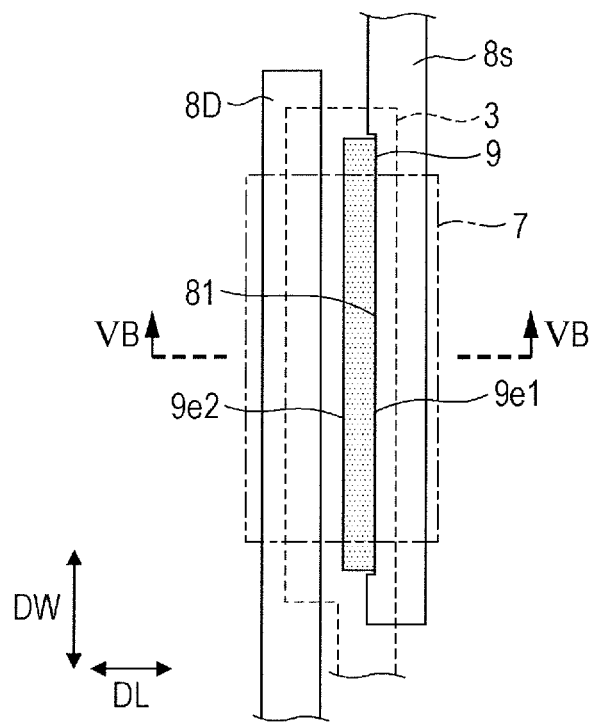
FIGS. 5A and 5B are a plan view and a cross-sectional view, respectively, that illustrate another DMX circuit TFT according to the first embodiment.
Figure 5B:
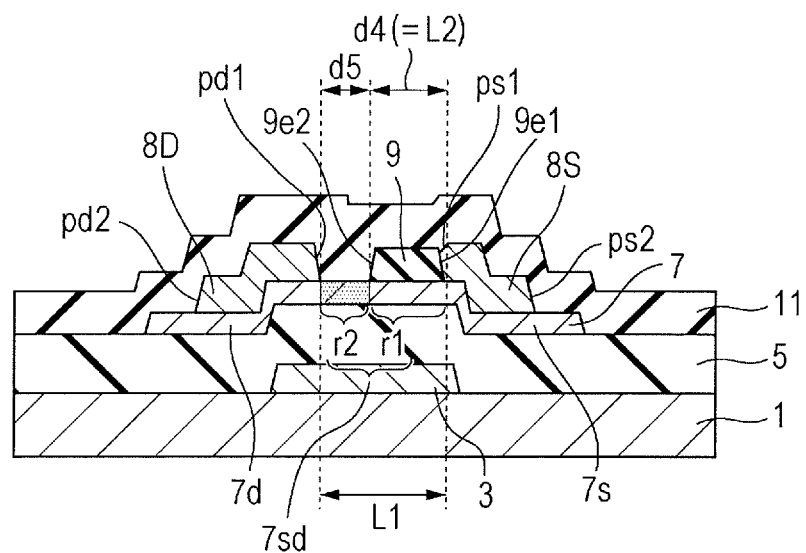

If a case where the patterning of the source conductive film 80 is performed using the mask 10n that is illustrated in FIG. 4D, a configuration is obtained in which the end portion ps1 facing toward the channel region, of one electrode (here, the source electrode 8S) of the source electrode 8S and the drain electrode 8D is brought into contact with only a flank surface 9e1 of the channel protection layer 9. FIGS. 5A and 5B are a plan view and a cross-sectional view, respectively, that illustrate a TFT that has this configuration.

In configurations that are illustrated in FIGS. 5A and 5B, the end portion ps1 of the source electrode 8S is brought into contact with only the flank surface 9e1 of the channel protection layer 9. More precisely, the source electrode 8S may sit on the upper surface of the channel protection layer 9. Furthermore, as illustrated in FIG. 5A, when viewed from the direction normal to the substrate 1, an edge portion facing toward the channel region, of the electrode (here, the source electrode 8S) that is brought into contact with the channel protection layer 9 can have a recessed portion 81 along the flank surface 9e1 of the channel protection layer 9.

With the method described above, the TFT 30 that has a small channel length can be manufactured while suppressing the characteristic defect of the oxide semiconductor TFT to ensure the high reliability, without complicating a manufacturing process in the related art. Furthermore, in the source and drain separation process, by performing the self-alignment process that uses the stepped shape of the channel protection layer 9, it is possible that the channel length L can be further reduced by the length d3 of each of the overlapping portions of the channel protection layer 9 and the source electrode 8S, and the length d2 of each of the overlapping portions of the channel protection layer 9 and the drain electrode 8D. Moreover, by using the self-alignment process, the source electrode 8S and the drain electrode 8D can be formed in such a manner as not to be positioned (not to sit) on the upper surface of the channel protection layer 9 when viewed from the direction normal to the substrate 1. Because of this, not only can the stepped shape due to the source electrode 8S or the drain electrode 8D be reduced, but overlapping areas of the source electrode 8S and the gate electrode 3 or overlapping areas of the drain electrode 8D and the gate electrode 3 can also be reduced. Thus, because a low-capacity TFT in which electric capacity is reduced between these electrodes can be manufactured, power consumption can be reduced.

Modification Example of the DMX Circuit TFT

Figure 6A:
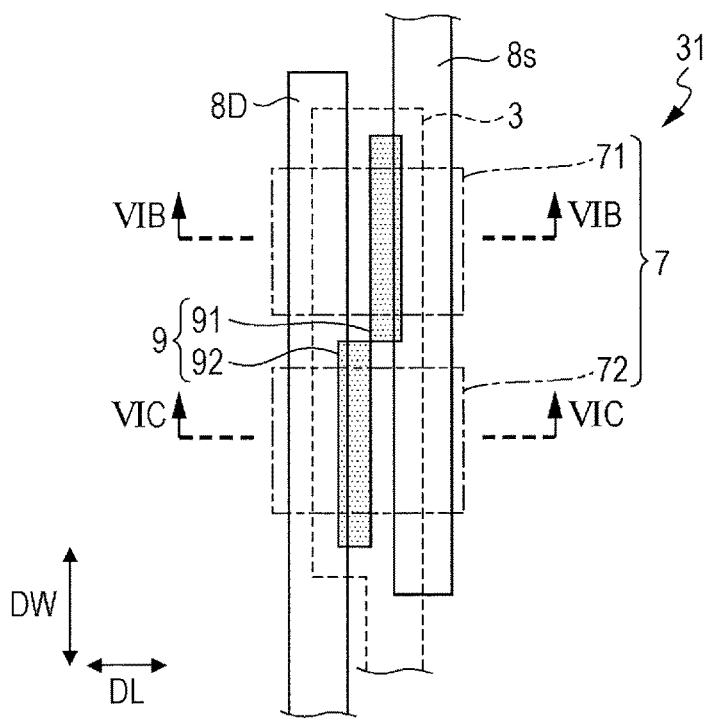
FIG. 6A is a plan view illustrating a DMX circuit TFT that is a first modification example.
Figure 6B:
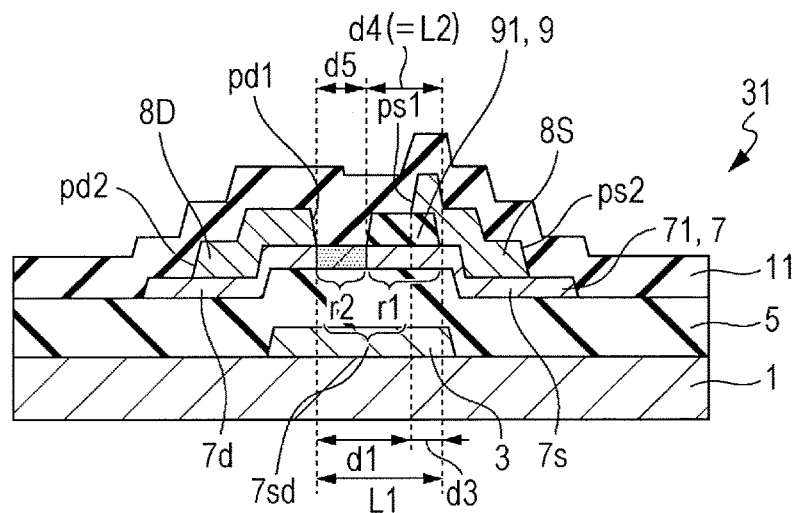
FIGS. 6B and 6C are cross-sectional views of the DMX circuit TFT.
Figure 6C:
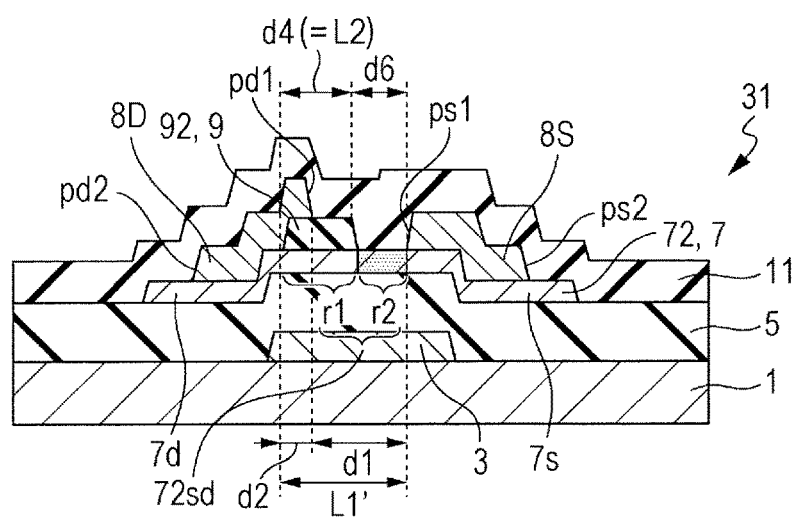

A modification example of the DMX circuit TFT according to the present embodiment will be described below with reference to the drawings. In FIG. 6A to 6C and subsequent figures, the same constituent element as in FIGS. 3A and 3B is given the same reference character.

Furthermore, a difference from the TFT 30 in FIGS. 3A and 3B will be described below in a focused manner and a description of the same configuration is suitably omitted.

First Modification Example and Second Modification Example

In DMX circuit TFTs that are the first modification example and the second modification example, at a certain cross-section in the channel length direction, an end portion facing toward the channel region, of one electrode of the source electrode and the drain electrode is brought into contact with the channel protection layer, and an end portion facing toward the channel region, of the other electrode is positioned at a distance away from the channel protection layer. Furthermore, at another certain cross-section in the channel length direction, an end portion facing toward the channel region, of the other electrode described above is brought into contact with the channel protection layer, and an end portion facing toward the channel region, of one electrode described above is positioned at a distance away from the channel protection layer.

FIG. 6A is a plan view illustrating a DMX circuit TFT 31 that is the first modification example. FIGS. 6B and 6C are cross-sectional views taken along line VIB-VIB and line VIC-VIC, respectively, in FIG. 6A.

In the TFT 31, the oxide semiconductor layer 7 is separated into multiple portions. At this point, the oxide semiconductor layer 7 is separated into a first semiconductor portion 71 and a second semiconductor portion 72. The first semiconductor portion 71 and the second semiconductor portion 72 are arranged, in the channel width direction DW, at a distance away from each other. The source electrode 8S and the drain electrode 8D the semiconductor portions 71 and 72, respectively. The source electrode 8S and the drain electrode 8D may extend crossing the semiconductor portions 71 and 72, respectively.

In the TFT 31, a channel region is formed on each of the first semiconductor portion 71 and the second semiconductor portion 72. In the first semiconductor portion 71, a channel region (referred to as "first channel region") is formed in a between-S-and-D area 71sd that is positioned between a source contact area 71s and a drain contact area 71d in the first semiconductor portion 71. In the second semiconductor portion 72, a channel region (referred to as "second channel region") is formed in an between-S-and-D area 72sd that is positioned between a source contact area 72s and a drain contact area 72d in the second semiconductor portion 72.

The channel protection layer 9 includes a first protection portion 91 that is positioned on a part of the first semiconductor portion 71, and a second protection portion 92 that is positioned on a part of the second protection portion 72. The first protection portion 91 covers only a portion of a first between-S-and-D area 71sd, and the second protection portion 92 covers only a portion of a second between-S-and-DB area 72sd. The first protection portion 91 and the second protection portion 92 may be separated from each other and may be linked to each other.

In the present embodiment, as illustrated in FIG. 6B, at a certain a cross-section in the channel length direction, which results from cutting across the first protection portion 91, the end portion ps1 facing toward the channel region, of the source electrode 8S is brought into contact with the channel protection layer 9 (here, the first protection portion 91), and the end portion pd1 facing toward the channel region, of the drain electrode 8D is positioned at a distance away from the channel protection layer 9 (the first protection portion 91). On the other hand, as illustrated in FIG. 6C, at a certain cross-section in the channel length direction, of the second protection portion 92, the end portion ps1 facing toward the channel region, of the source electrode 8S is positioned at a distance away from the channel protection layer 9 (here, the second protection portion 92) and the end portion pd1 facing toward the channel region, of the drain electrode 8D is brought into contact with the channel protection layer 9 (the second protection portion 92).

A portion is covered with the first protection portion 91 and the second protection portion 92, of each of the between-S-and-D areas 71sd and 72sd is referred to as the first portion r1, and a portion that is not covered with the first protection portion 91 and the second protection portion 92 is referred to as the second portion r2. Widths d5 and d6 of the second portions r2 of the between-S-and-D areas 71sd and 72sd may be the same and may be different. The second portion r2 may be a semiconductor area and may be a low-resistance area that has lower resistance than the first portion r1. In a case where the second portion r2 is the semiconductor area, the entire between-S-and-D area 71sd is the first channel region, and the entire between-S-and-D area 72sd is the second channel region. In a case where the second portion r2 is the low-resistance area, the first portions r1 of the between-S-and-D areas 71sd and 72sd are the first channel region and the second channel region.

In the TFT 31 that is the first modification example, a portion of each of the between-S-and-D areas 71sd and 72sd is covered with the channel protection layer 9 (the first protection portion 91 or the second protection portion 92), and because of this, the occurrence of the corrosion in the first semiconductor portion 71 and the second semiconductor portion 72 can be suppressed. Furthermore, in a cross-section along the channel length direction, only one of the source electrode 8S and the drain electrode 8D is brought into contact with the channel protection layer 9, and because of this, channel lengths of the first channel region and the second channel region can be decreased.

In the first modification example, the first channel length L1 in the first semiconductor portion 71 is a length that results from adds the length d3 of each of the overlapping portions of the source electrode 8S and the channel protection layer 91, to the length (the inter-electrode distance) between the source electrode 8S and the drain electrode 8D (L1=d1+d3). Moreover, first channel length L1' in the second semiconductor portion 72 is a length that results from the length d2 of each of the overlapping portions of the drain electrode 8D and the channel protection layer 92, to the length (the inter-electrode distance) d1 between the source electrode 8S and the drain electrode 8D (L1'=d1+d2). In the present embodiment, as illustrated in FIGS. 6B and 6C, the first semiconductor portion 71 and the second semiconductor portion 72 are symmetrically arranged in such a manner that amounts of shift in inter-layer alignment between the channel protection layer 91 and the source electrode 8S and between the channel protection layer 92 and the drain electrode 8D are cancelled out each other. The first semiconductor portion 71 and the second semiconductor portion 72 may have the same channel width. Values that are the lengths d2 and d3 change according to the amount of shift in inter-layer alignment, but a value that is d2+d3 does not change according to the amount of shift in inter-layer alignment. For this reason, an average channel length LA of the TFT 31 according to the present embodiment=(L1+L1')/2=d1+(d2+d3)/2 does not change according to the amount of shift in inter-layer alignment. Therefore, because it is difficult for on-electric current in the TFT 31 to change according to the amount of shift in inter-layer alignment, the operation reliability of a DMX circuit that includes the TFT 31 and of a device that uses the DMX circuit can be ensured.

It is noted that in the first modification example, the oxide semiconductor layer 7 is divided into two portions, but that the oxide semiconductor layer 7 may be divided into three or more portions and the oxide semiconductor layer 7 may not be divided.

Figure 7A:
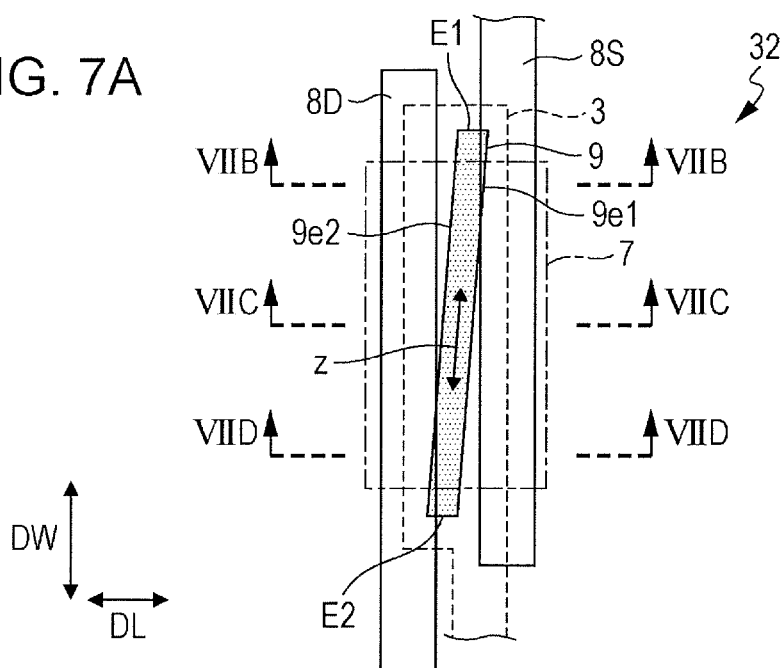
FIG. 7A is a plan view illustrating a DMX circuit TFT that is a second modification example.
Figure 7B:
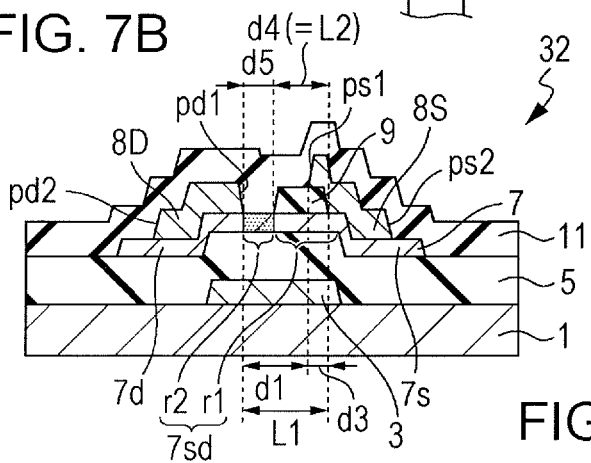
FIGS. 7B to 7D are cross-sectional views of the DMX circuit TFT.
Figure 7C:
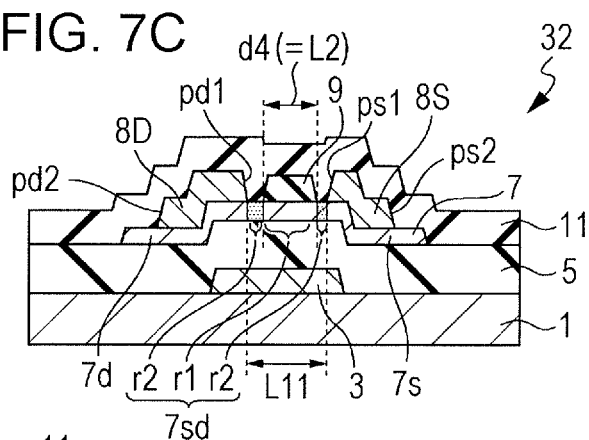
Figure 7D:
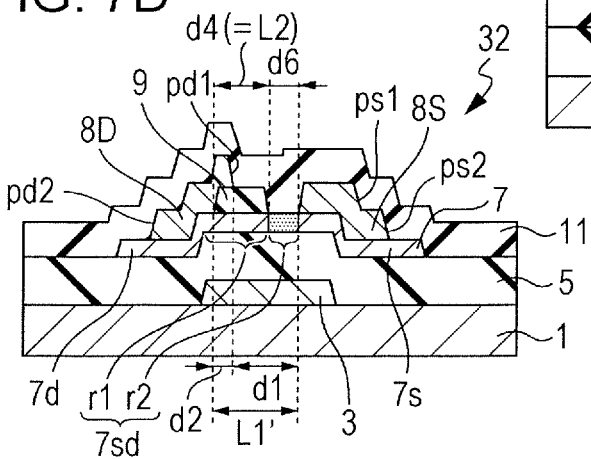

FIG. 7A is a plan view illustrating a DMX circuit TFT 32 that is the second modification example. FIGS. 7B to 7D are cross-sectional views taken along line VIIB-VIIB, line VIIC-VIIC, and line VIID-VIID, respectively, in FIG. 7A.

In the TFT 30 that is illustrated in FIGS. 3A and 3B, the source electrode 8S, the drain electrode 8D, and the channel protection layer 9 are substantially parallel to each other and extend in the channel width direction DW. In contrast to this, in the TFT 32 that is the second modification example, the source electrode 8S and the drain electrode 8D extend in the channel width direction DW, and the channel protection layer 9 extends in a z direction that intersects the channel width direction DW and the channel length direction DL. One end portion E1 in the z direction, of the channel protection layer 9 is brought into contact with the source electrode 8S and is not brought into contact with the drain electrode 8D. The other end portion E2 is brought into contact with the drain electrode 8D and is not brought into contact with the source electrode 8S. The z direction in which the channel protection layer 9 extends is not particularly limited, but, for example, may be a direction that makes an angle that is equal to or greater than 3° and is equal to or smaller than 15°, with respect to the channel width direction DW.

In this example, as illustrated in FIG. 7B, in a cross-section that results from cutting across the end portion E1 of the channel protection layer 9 or the vicinity of the end portion E1, the end portion ps1 facing toward the channel region, of the source electrode 8S is brought into contact with the channel protection layer 9, and the end portion pd1 facing toward, of the drain electrode 8D is positioned at a distance away from the channel protection layer 9 (the first channel length L1=d1+d3). Furthermore, as illustrated in FIG. 7D, in a cross-section that results from cutting across the end portion E2 of the channel protection layer 9 or the vicinity of the end portion E2 in the channel length direction DL, the end portion ps1 facing toward the channel region, of the source electrode 8S is positioned at a distance away from the channel protection layer 9, and the end portion pd1 facing toward the channel region, of the drain electrode 8D is brought into contact with the channel protection layer 9 (the first channel length L1'=d1+d2). A width d4 in the channel length direction DL, of the channel protection layer 9 may be smaller than the inter-electrode distance d1. In this case, as illustrated in FIG. 7C, at a certain cross-section in the channel length direction DL, none of the end portions ps1 and pd1 of the source electrode 8S and the drain electrode 8D is brought into contact with the channel protection layer 9 (the first channel length L11=d1). Although not illustrated, the channel protection layer 9 may be greater than the inter-electrode distance d1 (the first channel length L11=d1+d2+d3).

In the second modification example, the values that are the lengths d2 and d3 change as well according to the amount of shift in inter-layer alignment, but a value that results from integrating d2+d3 does not change as well according to the amount of shift in inter-layer alignment. For this reason, an average channel length of the TFT 32 according to the present embodiment does not change according to the amount of shift in inter-layer alignment.

In this manner, in the TFT 32 that is the second modification example, as in the TFT 30, the channel length can be decreased as well while suppressing the corrosion of the oxide semiconductor layer 7. Furthermore, in the second modification example, a pattern of the channel protection layer 9 is formed in the direction of canceling an influence of the shift in inter-layer alignment in the channel length direction DL, which occurs between the channel protection layer 91 and the source electrode 8S and between the channel protection layer 92 and the drain electrode 8D. Because of this, an influence that the shift in inter-layer alignment exerts on the TFT characteristic can be decreased.

It is noted that any one of the TFTs 31 and 32 that are the first and second modification examples, respectively, (but are different in the pattern of the channel protection layer 9 or the like) can be manufactured using a known method. Although not illustrated, in the TFTs 31 and 32, the source electrode 8S or the drain electrode 8D may be brought into contact with only the flank surface of the channel protection layer 9 as well without being brought into contact with the upper surface of the channel protection layer 9 (refer to FIGS. 5A and 5B).

Third Modification Example

Figure 8A:
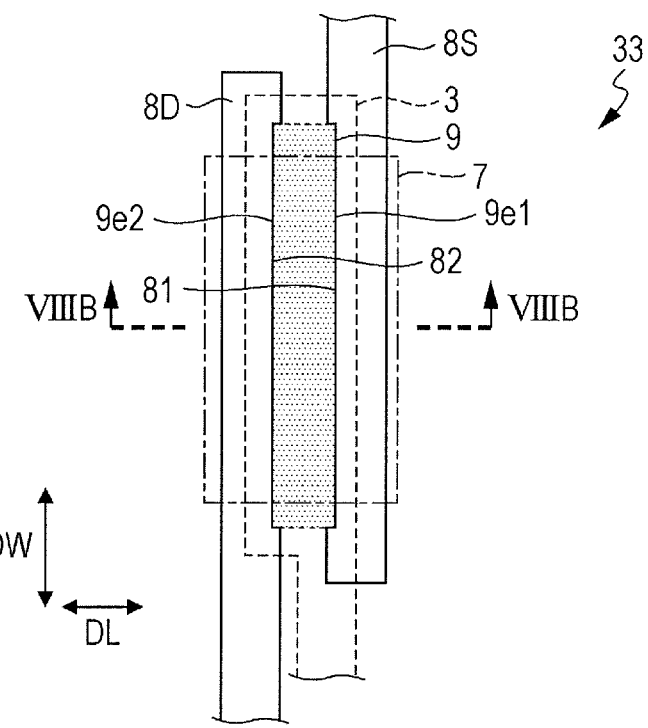
FIGS. 8A and 8B are a plan view and a cross-sectional view, respectively, that illustrate a DMX circuit TFT that is a third modification example.
Figure 8B:
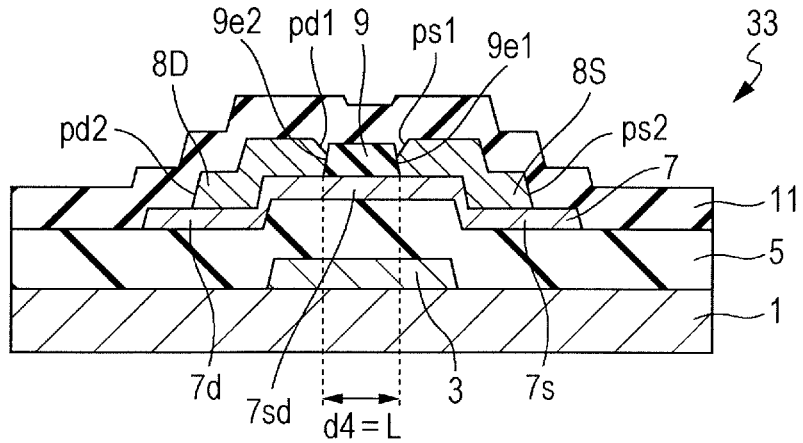

FIG. 8A is a plan view illustrating a DMX circuit TFT 33 that is a third modification example. FIG. 8B is a cross-sectional view taken along line VIIIB-VIIIB in FIG. 8A.

The TFT 33 is different from the TFT 30 that is illustrated in FIGS. 3A and 3B, in that both the source electrode 8S and the drain electrode 8D are brought into contact with the channel protection layer 9. In this example, at a certain cross-section in the channel length direction DL, the end portions ps1 and pd1 facing toward the channel region, of the source electrode 8S and the drain electrode 8D are brought into contact with flank surfaces 9ea and 9e2, respectively, without being brought into contact with the upper surface of the channel protection layer 9. Furthermore, edge portions facing toward the channel region, of the source electrode 8S and the drain electrode 8D, when viewed from the direction normal to the substrate 1, have the recessed portions 81 and 82 along the flank surfaces 9e1 and 9e2, respectively, of the channel protection layer 9, when viewed from the direction normal to the substrate 1. In the TFT 33, the width d4 in the channel length direction, of the channel protection layer 9 is the channel length (L=d4).

A photolithography that uses a photosensitive resist material is used for formation of the source electrode 8S and the drain electrode 8D. At this point, the source electrode 8S and the drain electrode 8D can be formed by the self-alignment process that uses the stepped shape of the channel protection layer 9. In this case, the overlapping between the channel protection layer 9 and each of the source electrode 8S and the drain electrode 8D may not be considered. Because of this, the channel length L (that is, the width d4 of the channel protection layer 9) can be more effectively decreased. Furthermore, because the entire between-S-and-D area 7sd is covered with the channel protection layer 9, the occurrence of the corrosion can be more reliably suppressed.

Figure 8C:
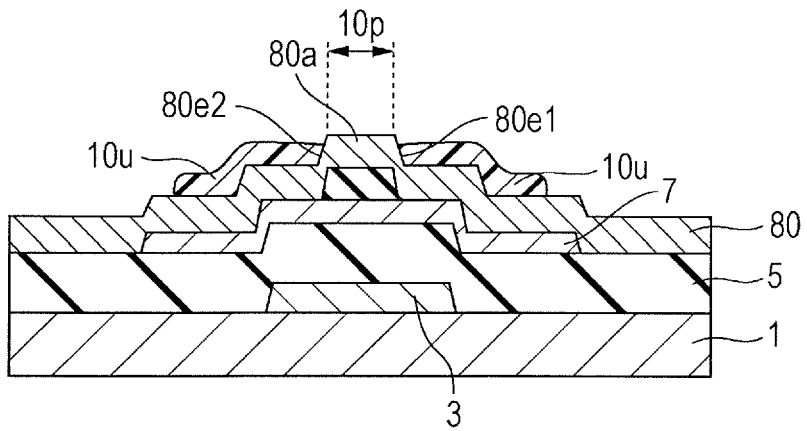
FIG. 8C is a cross-sectional view for describing a process of manufacturing a TFT.

FIG. 8C is a cross-sectional view for describing the source and drain separation process that is to be performed when manufacturing the TFT 33 that is the third modification example.

First, in the same method as when manufacturing the TFT 30, on the substrate 1, the gate electrode 3, the gate insulation layer 5, and the oxide semiconductor layer 7 and the channel protection layer 9 are formed, and the source conductive film 80 is formed in such a manner as to cover the oxide semiconductor layer 7 and the channel protection layer 9. The source conductive film 80 has the projecting portion 80a that reflects the stepped shape of the channel protection layer 9.

Subsequently, a resist film is formed on the source conductive film 80, and mask 10u is formed by exposure and development. In this example, the mask 10u has the opening portion 10p through which the upper surface of the projecting portion 80a is exposed along the channel length direction DL. The mask 10u (a portion that does not has an opening, of the mask 10u) is brought into contact with the flank surfaces 80e1 and 80e2 of the projecting 80a, but is not formed (does not sit) on the projecting portion 80a. The mask 10u, for example, can be formed in a self-alignment manner, using a stepped shape of the projecting portion 80a that reflects the stepped shape of the channel protection layer 9 (refer to FIG. 4B).

In the present embodiment, it is preferable that the resist material, the thickness of and the flank-surface taper shape of the flank surface of the channel protection layer 9, the thickness of the source conductive film 80, the thickness of the resist film 10, and the like are controlled in such a manner the self-alignment process described above is realized. For example, the thickness of the channel protection layer 9 may be equal to or greater than half of the thickness of the source conductive film 80 (that is, the thickness of each of the source electrode 8S and the drain electrode 8D). Alternatively, the channel protection layer 9 may be thicker than the source conductive film 80. Furthermore, the taper angle of the flank-surface taper shape of the channel protection layer 9, for example, may be equal to or greater than 45° and be smaller than 90°.

Subsequently, the patterning of the source conductive film 80 is performed using the mask 10u. Accordingly, the source electrode 8S that is brought into contact with the channel protection layer 9 and the drain electrode 8D that is positioned at a distance away from the channel protection layer 9 are formed (the source and drain separation process). Although not illustrated, the source bus line is also formed from the source conductive film 80.

It is noted that the mask 10u may also be formed (sit) on a portion of the projecting portion 80a. In this case, by the patterning of the source conductive film 80, one of or both of the source electrode 8S and the drain electrode 8D can be formed in such a manner as to be brought into contact with a portion of the upper surface of the channel protection layer 9.

Fourth Modification Example and Fifth Modification Example

The DMX circuit TFT may have a double gate structure in which two gate electrodes between which the oxide semiconductor layer is interposed are provided. Alternatively, the DMX circuit TFT may have a top gate structure in which the gate electrode is provided on a side opposite to the substrate, of the oxide semiconductor layer.

Figure 9A:
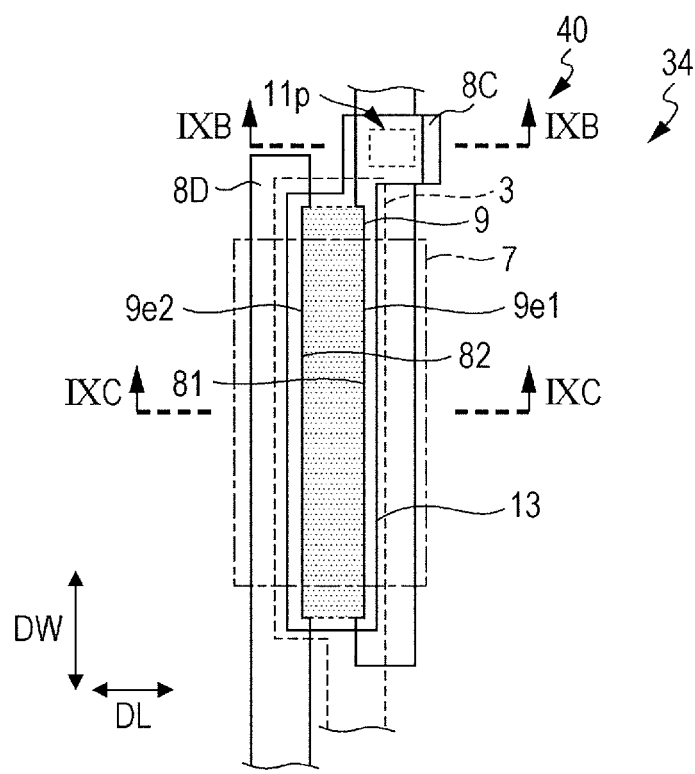
FIG. 9A is a plan view illustrating a DMX circuit TFT that is a fourth modification example.
Figure 9B:
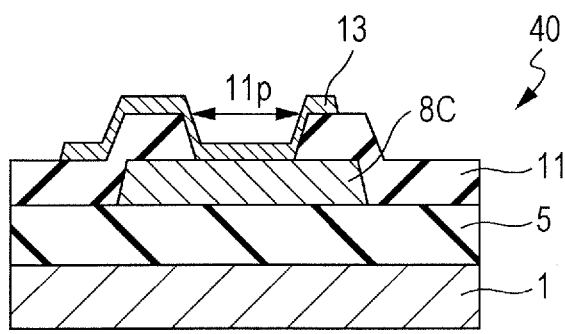
FIGS. 9B and 9C are cross-sectional views of the DMX circuit TFT.
Figure 9C:
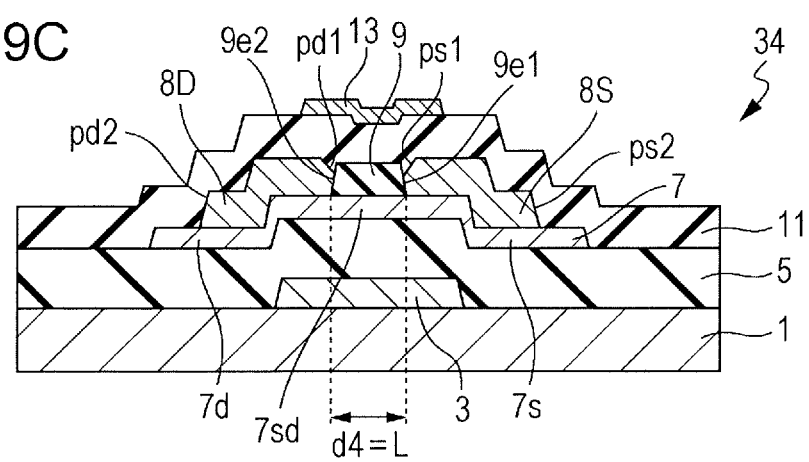

FIG. 9A is a plan view illustrating a DMX circuit TFT 34 that is the fourth modification example. FIGS. 9B and 9C are cross-sectional views taken along line IXB-IXB and line IXC-IXC, respectively, in FIG. 9A.

The TFT 34 has the double gate structure. The TFT 34 is different from the TFT 33 that is illustrated in FIGS. 8A to 8C, in that the TFT 34 has an upper gate electrode 13 on the inorganic insulation layer 11.

The inorganic insulation layer 11 is positioned between the oxide semiconductor layer 7 and the upper gate electrode 13 and functions as a gate insulation film. In this example, the upper gate electrode 13 is electrically connected to the source electrode 8S in a contact portion 40. It is noted that the upper gate electrode 13 may be electrically connected to the gate electrode 3 and may be connected to a fixed electric potential (for example, may be grounded). The upper gate electrode 13 may be formed using the same transparent conductive film as the pixel electrode.

In the contact portion 40, for example, the upper gate electrode 13 and a source connection portion 8C that results from formation for integration with the source electrode 8S are electrically connected within an opening portion 11p that is formed in the inorganic insulation layer 11. The contact portion 40, for example, may be positioned adjacent to the TFT 34.

In this example, any one of the source electrode 8S and the drain electrode 8D is brought into contact with the channel protection layer 9, but in the same manner as in the TFTs 30 to 32, only one electrode may be brought into contact with the channel protection layer 9.

Figure 10A:
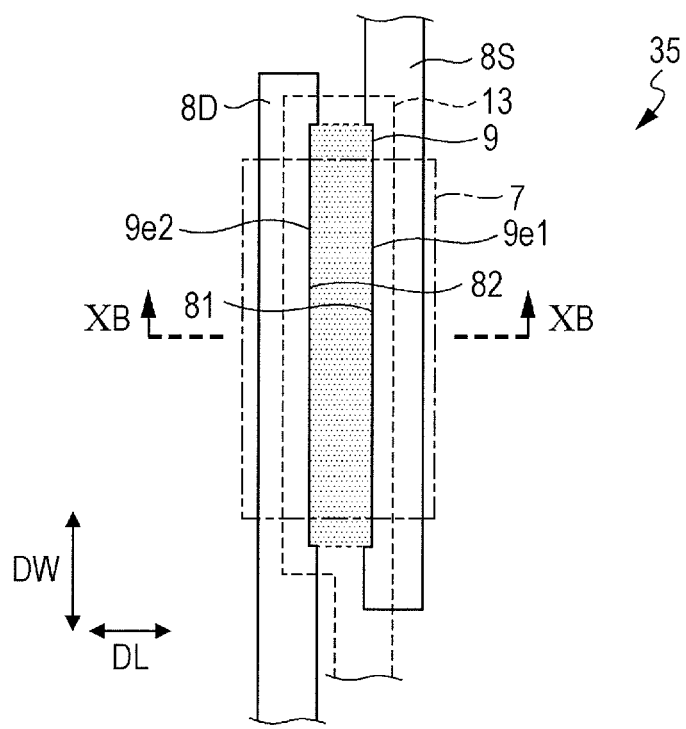
FIGS. 10A and 10B are a plan view and a cross-sectional view, respectively, that illustrate a DMX circuit TFT that is a fifth modification example.
Figure 10B:
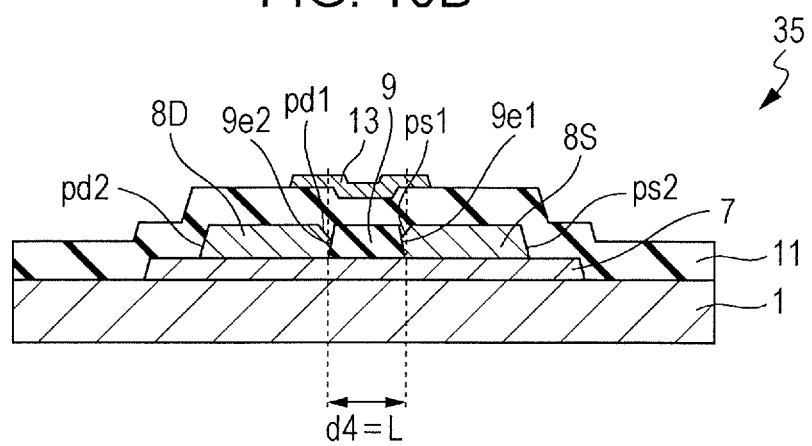

FIG. 10A is a plan view illustrating a DMX circuit TFT 35 that is the fifth modification example. FIG. 10B is a cross-sectional view taken along line XB-XB in FIG. 10A.

The TFT 35 has a top gate structure. The TFT 35 is the same as the TFT 33 that is illustrated in FIGS. 8A to 8C, in that, without having the gate electrode 3 and the gate insulation layer 5 that is positioned toward the substrate 1 on the oxide semiconductor layer 7, the TFT 35 instead has the upper gate electrode 13 on the inorganic insulation layer 11. The inorganic insulation layer 11 is positioned between the oxide semiconductor layer 7 and the upper gate electrode 13 and functions as a gate insulation film. The upper gate electrode 13 may be formed using the same transparent conductive film as the pixel electrode.

In this example, any one of the source electrode 8S and the drain electrode 8D is brought into contact with the channel protection layer 9, but in the same manner as in the TFTs 30 to 32, only one electrode may be brought into contact with the channel protection layer 9.

The active matrix substrate 1000 according to the present embodiment may include at least one of the TFTs 30 to 35, as the DMX circuit TFT. The active matrix substrate 1000 may further include a TFT that has a different structure than the TFTs 30 to 35. For example, the active matrix substrate 1000 may include as any other TFT and or any other pixel TFT the etch stop type TFT (refer to FIGS. 17A to 17C) that has a structure in which any one of the end portions ps1 and pd1 facing toward, of the drain electrode 8D and the source electrode 8S is brought into contact to the channel protection layer 9.

Example of a Layout of the Demultiplexer Circuit DMX_A

Figure 11:
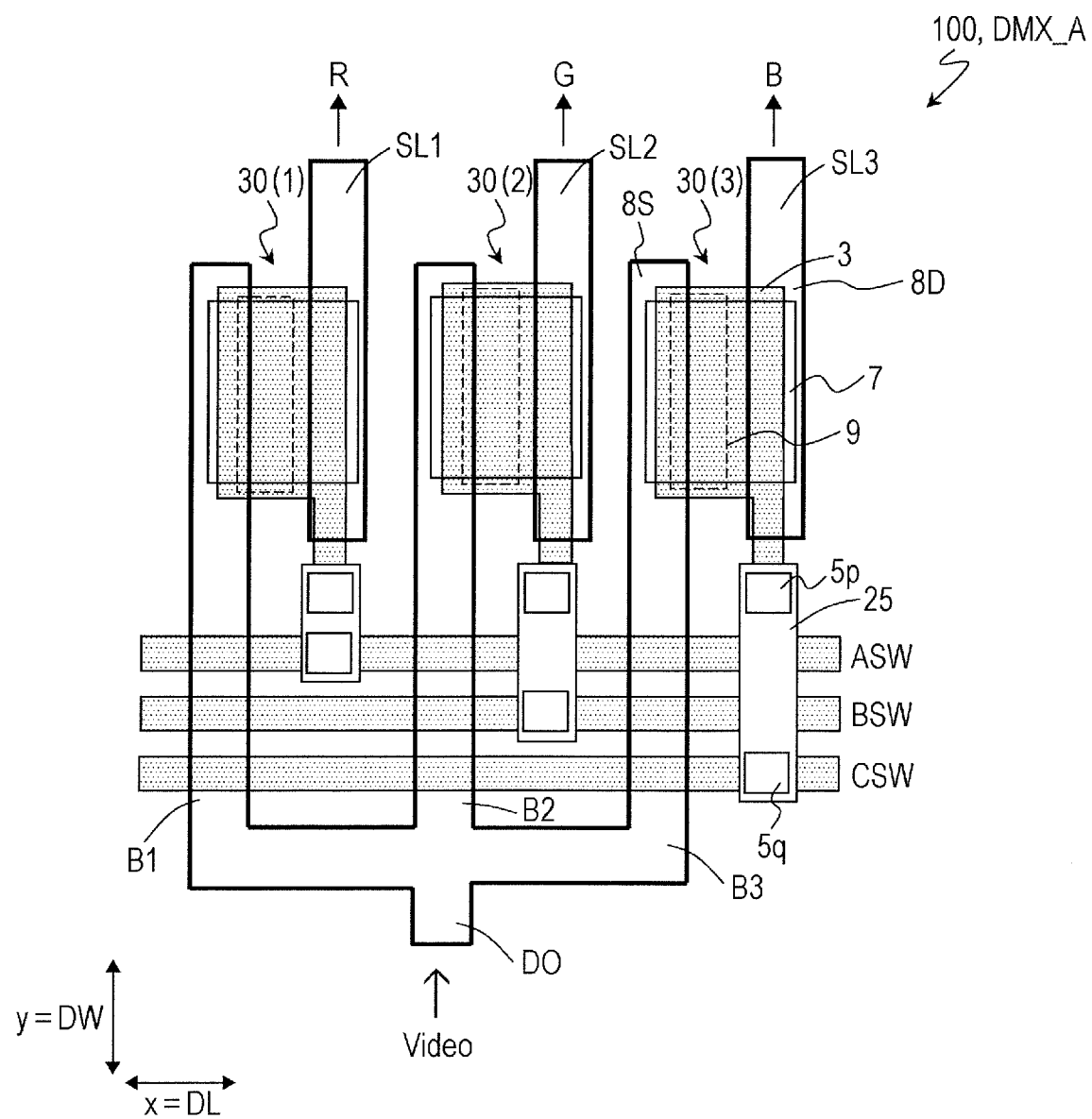
FIG. 11 is a plan view illustrating a layout of a unit circuit in the demultiplexer circuit.

FIG. 11 is a plan view illustrating a layout of the unit circuit 100 of the demultiplexer circuit DMX_A. At this point, the unit circuit 100 is positioned for source bus line SL1 to SL3 that are associated with R, G, and B pixels, respectively (more precisely, n=3).

The unit circuit 100 includes three TFTs, TFTs 30(1) to 30(3) (which, in some cases, are hereinafter collectively referred to as "TFT 30") that are supported on the substrate 1, source bus lines SL1 to SL3 (which, in some cases, are hereinafter collectively referred to as "source bus line SL") that extend from the display area DR, one video signal line DO, branch wiring lines B1 to B3 (which, in some cases, are hereinafter collectively referred to as "branch wiring line B"), and control signal trunk lines ASW to CSW (which, in some case, are hereinafter collectively referred to as "control signal trunk line SW). The video signal line DO is electrically connected to the branch wiring lines B1 to B3. In this example, the source bus line SL extends in the y direction, and the control signal trunk line SW extends in the x direction.

Each of the TFTs 30(1) to 30(3) has the same structure as the TFT 30 that is described above with reference to FIGS. 3A and 3B. It is noted that each of the TFTs 30(1) to 30(3) may have the same structure as the TFTs 31 to 35.

The branch wiring line B, the video signal line DO, and the source electrode 8S and the drain electrode 8D of the TFT 30 may be formed within a source metal layer (more precisely, using the same conductive film as the source bus line SL).

The control signal trunk line SW and the gate electrode 3 may be formed within the same conductive layer, for example, within the gate metal layer (more precisely, using the same conductive film as the gate bus line GL).

The source bus line SL may extend toward the source driver SD from the display area in the y direction, and Each of the TFTs 30 may is positioned between two adjacent source bus lines SL. In this example, the TFT 30 is positioned in such a manner that the channel length direction DL is approximately parallel to the x direction and that the channel width direction DW is approximately parallel to the y direction.

The source electrode 8S is electrically connected to the corresponding branch wiring line B. In this example, the branch wiring line B includes a portion that extends in the y direction toward the display area from the video signal line DO when viewed from the direction normal to the substrate 1 and that functions as the source electrode 8S of the TFT 30. That is, the branch wiring line B and the source electrode 8S are integrally formed.

The gate electrode 3 of the TFT 30 is electrically connected to the corresponding control signal trunk line SW. In this example, the gate electrode 3 extends toward the control signal trunk line SW in the y direction. The extending portion is referred to as "gate extension portion". The gate extension portion is electrically connected to the corresponding control signal trunk line SW through connection wiring line 25 that is formed within the source metal layer.

According to the present embodiment, the width in the channel length direction, of the TFT 30 can be decreased. Because of this, it is possible that the TFT 30 is positioned between two adjacent source bus lines SL. The TFT 30 according to the present embodiment can suitably find application when the demultiplexer circuit DMX is formed in a high-definition active matrix substrate.

A configuration of the demultiplexer circuit DMX according to the present embodiment is not limited to the configuration described above.

The demultiplexer circuit DMX may include a sub-circuit that is made up of at least two unit circuits (hereinafter referred to "first unit circuit" and "second unit circuit", respectively). N source bus lines SL that are connected to the DMX circuit TFT of the first unit circuit, and n source bus lines SL that are connected to the DMX circuit TFT of the second unit circuit may be arranged in the row direction in a such a manner that Z (Z is an integer that is equal to or greater than 1, for example, Z=1) source bus lines SL connected to the DMX circuit TFT and Z source bus lines SL connected to the DMX circuit TFT alternate.

Figure 12:
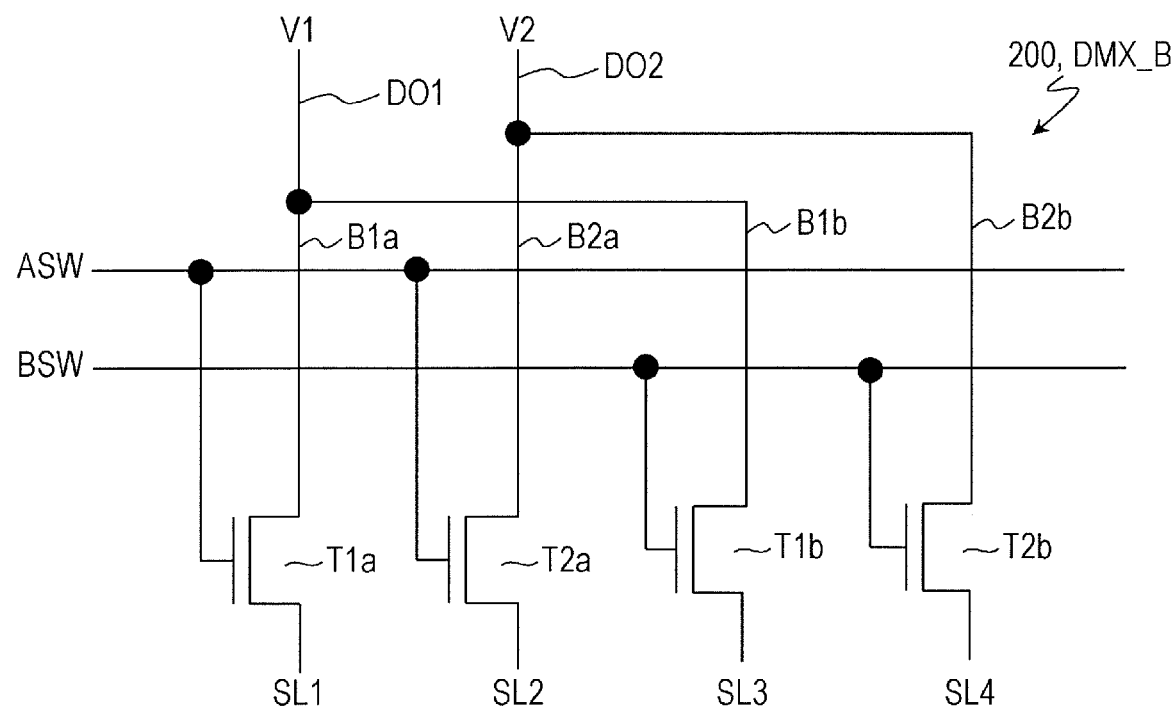
FIG. 12 is a diagram illustrating a sub-circuit of another demultiplexer circuit according to the first embodiment.

FIG. 12 is a diagram illustrating a portion of a demultiplexer circuit DMX_B that is another demultiplexer circuit according to the present embodiment, and illustrates a sub-circuit 200 that is made up of the first unit circuit and the second unit circuit.

FIG. 12 illustrates only four source bus lines of the multiple source bus lines SL. The four source bus lines SL are referred to a first source bus lines SL1, a second source bus line SL2, a third source bus line SL3, and a fourth source bus line SL4, respectively, starting from one end portion (here, a left end portion).

The sub-circuit 200 includes the first unit circuit and the second unit circuit, and multiple control signal trunk lines SW (here, two control signal trunk lines, control signal trunk lines ASW and BSW).

In this example, each unit circuit is associated with two source bus lines SL (that is, n=2). The first unit circuit is associated with the first source bus line SL1 and the third source bus line SL3. A video signal V1 from the corresponding video signal line DO1 is distributed to the first source bus line SL1 and the third source bus line SL3 through the first unit circuit. The second unit circuit is associated with the second source bus line SL2 and the fourth source bus line SL4. A video signal V2 from a video signal line DO2 that is different from the video signal V1 from the video signal line DO1 in the first unit circuit is distributed to the second source bus line SL2 and the fourth source bus line SL4 through the second unit circuit.

The first unit circuit includes two thin film transistors (DMX circuit TFTs), thin film transistors T1a, and T1b, and two branch wiring lines, branch wiring lines B1a and B1b. The second unit circuit includes two thin film transistors, thin film transistors T2a and T2b, and two branch wiring lines, branch wiring lines B2a and B2b. The thin film transistors T1a, T1b, T2a, and T2b have the structure that is described above with reference to FIGS. 3A, 3B, 5A and 5B.

Drain electrodes of the thin film transistors T1a and T1b of the first unit circuit are connected to the first source bus line SL1 and the third source bus line SL3, respectively. Source electrodes are connected to the branch wiring lines B1a and B1b, respectively, and are electrically connected to the video signal line DO1 through the branch wiring lines B1a and B1b, respectively.

Drain electrodes of the thin film transistors T2a and T2b of the second unit circuit are connected to the second source bus line SL2 and the fourth source bus line SL4, respectively. Source electrodes are connected to the branch wiring lines B2a and B2b, respectively, and are electrically connected to the video signal line DO2 through the branch wiring lines B2a and B2b, respectively.

Each of the gate electrodes of the thin film transistors T1a and T2a is connected to the control signal trunk line ASW. A control signal is supplied from the control signal trunk line ASW to each of the gate electrodes of the thin film transistors T1a and T2a. Each of the gate electrodes of the thin film transistors T1b and T2b is connected to the control signal trunk line BSW. A control signal is supplied from the control signal trunk line BSW to each of the gate electrodes of the thin film transistors T1b and T2b.

Figure 13:
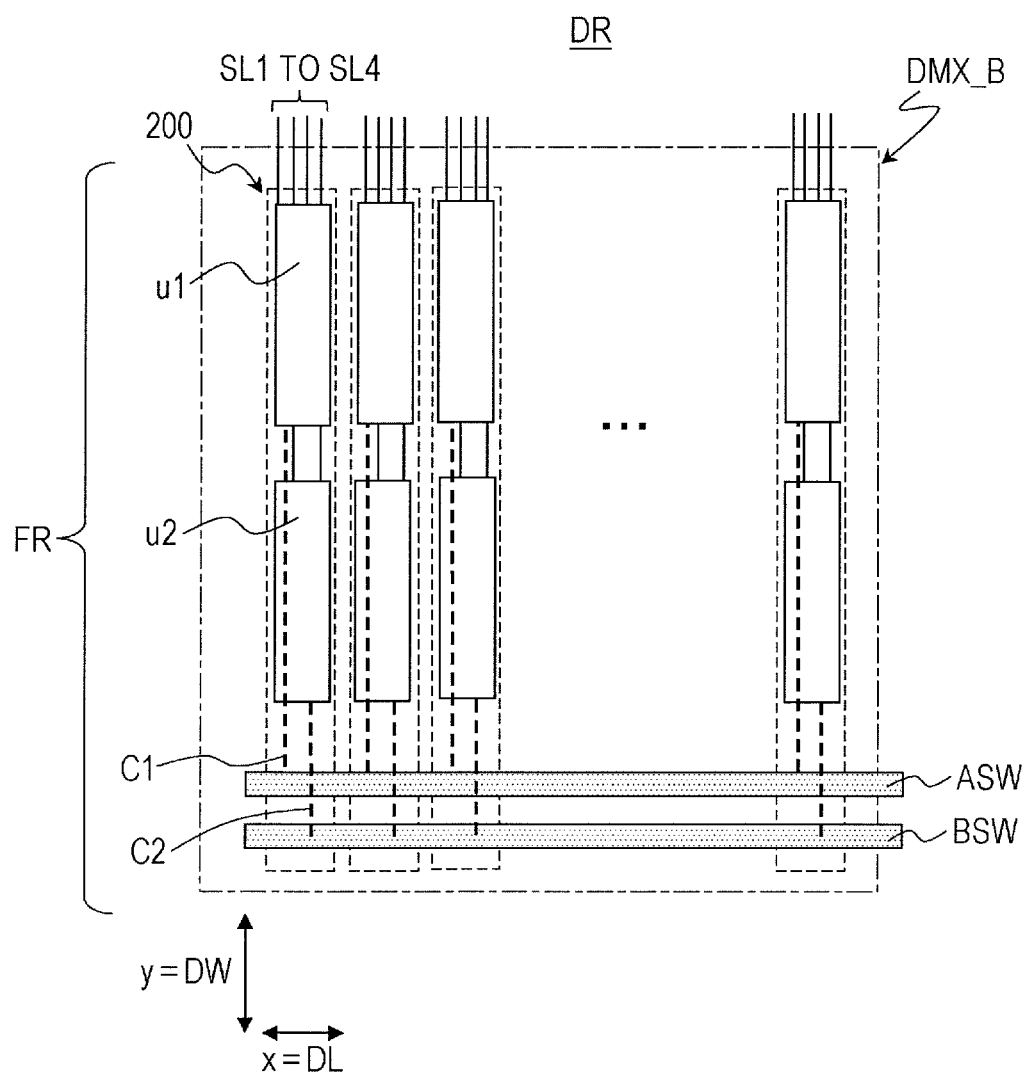
FIG. 13 is a plan view illustrating an outline of a layout of a demultiplexer circuit.

FIG. 13 is a plan view illustrating an example of a layout of the demultiplexer circuit DMX_B according to the present embodiment. The demultiplexer circuit DMX_B has multiple sub-circuits 200. Each sub-circuit 200, as described above with reference to FIG. 12, has the first unit circuit and the second unit circuit. Each of the first unit circuit and the second unit circuit is associated with two source bus lines SL.

As illustrated, multiple sub-circuits 200 in the demultiplexer circuit DMX_B may be arranged in the x direction when viewed from the direction normal to the substrate 1. Each sub-circuit 200 may have a shape that extends in the y direction. Furthermore, in each sub-circuit 200, a first unit circuit formation area u1 in which the DMX circuit TFT of the first unit circuit is positioned may be positioned toward the display area in a second unit circuit formation area u2 in which the DMX circuit TFT of the second unit circuit. More precisely, the first unit circuit may be positioned between the second unit circuit and the display area. In the present specification, this configuration is referred to as "two-step configuration".

Each sub-circuit 200 of the demultiplexer circuit DMX_B includes n control signal branch lines (here, two control signal branch lines), control signal branch lines C1 and C2. The control signal branch lines C1 and C2 are electrically connected to the control signal trunk lines ASW and BSW, respectively. In the first unit circuit and the second unit circuit of each sub-circuit 200, the control signal branch lines C1 and C2 are shared.

Although not illustrated, a source driver that is mounted using a COG mounting method is provided between peripheral edges of the demultiplexer circuit DMX_B and the non-display area FR. The control signal trunk line SW and the video signal line DO, for example, are arranged between the demultiplexer circuit DMX_B and the source driver. The control signal trunk lines ASW and BSW may extend in the x direction.

In this manner, in the present modification example, it is possible that a common control signal branch line C is provided in two or more unit circuits. Accordingly, an area that is desired for the demultiplexer circuit DMX can be more effectively reduced. Furthermore, by increasing the channel width W in the y direction, an electric current drive force can be further increased. It is noted that at this point, the two-step configuration is illustrated as an example, but that a three- or greater-step configuration can also be employed.

First Layout of the Sub-Circuit 200

Figure 14:
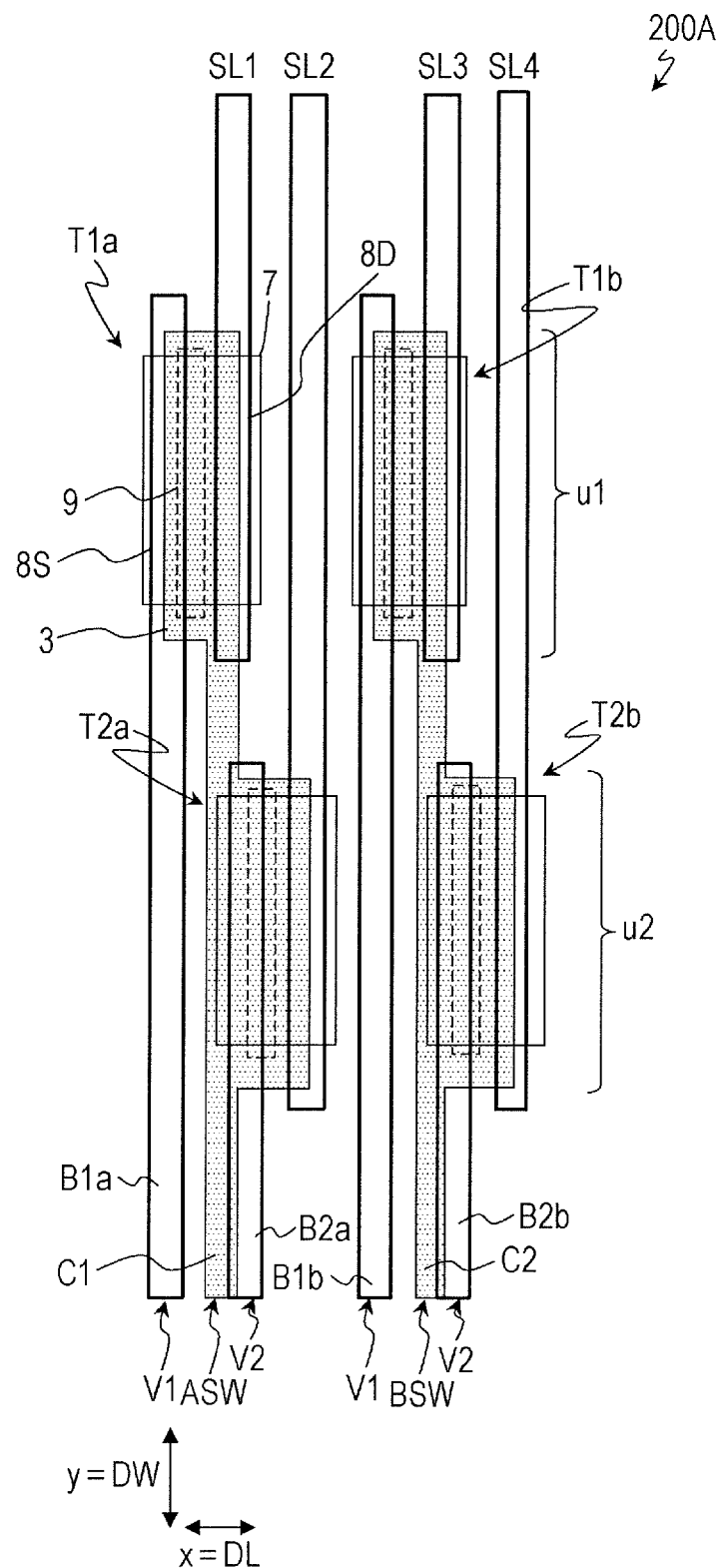
FIG. 14 is a plan view illustrating an example of a layout of a sub-circuit in the demultiplexer circuit.

FIG. 14 is an enlarged plan view illustrating a layout of a sub-circuit 200A in the demultiplexer circuit DMX_B.

The first unit circuit has the thin film transistors T1a and T1b that are arranged in the first unit circuit formation area u1, and the branch wiring lines B1a and Bib. The second unit circuit has the thin film transistors T2a and T2b that are arranged in the second unit circuit formation area u2, and the branch wiring lines B2a and B2b. The first and second unit circuits have common control signal branch lines C1 and C2. At this points, the thin film transistors T1a and T2a that are adjacent to each other in the y direction share the control signal branch line C1, and the thin film transistors T1b and T2b that are adjacent to each other in the y direction share the control signal branch line C2. The control signal branch lines C1 and C2 are electrically connected to the control signal trunk lines ASW and BSW, respectively.

The branch wiring lines B1a, B2a, B1b, and B2b (which, in some cases, are collectively, referred to as "branch wiring line B") of the first unit circuit and the second unit circuit, the control signal branch lines C1 and C2, and the source bus lines SL1 to SL4 all extend in the y direction. In this example, the channel length direction DL of each thin film transistor is approximately parallel to the x direction, and the channel width direction DW is approximately parallel to the y direction.

Each of the control signal branch lines C1 and C2 includes a portion that functions as the gate electrode of the corresponding DMX circuit TFT. For example, the control signal branch line C1 is positioned between the branch wiring lines B1a and B2a when viewed from the direction normal to the substrate 1. The control signal branch line C1 has a projecting portion that protrudes toward the branch wiring line B2a in the x direction and functions as the gate electrode of the thin film transistor T2a, and a projecting portion that protrudes toward the branch wiring line B2a in the x direction and functions as the gate electrode of the thin film transistor T1a. The oxide semiconductor layer 7 of the thin film transistor T1a and the thin film transistor T2a are arranged on these projecting portions, respectively, of the control signal branch line C1. In this manner, one DMX circuit TFT in the first unit circuit and one DMX circuit TFT in the second unit circuit have the gate electrode that is formed for integration with the same control signal branch line C, and are positioned, at a distance away from each other, on the same control signal branch line C (the two-step configuration).

The DMX circuit TFT of the first unit circuit is positioned between N-th and (N+2)-th source bus line SL that are associated with the second unit circuit when viewed from the direction normal to the substrate 1 (n is a natural number). For example, the thin film transistor T1b is positioned between the second source bus line SL2 and the fourth bus line SL4. Furthermore, the DMX circuit TFT of the second unit circuit is positioned between two adjacent branch wiring lines B in the first unit circuit. For example, the thin film transistor T2a is positioned between the branch wiring lines B1a and B1b of the first unit circuit.

Configuration of the Pixel Area PIX

Subsequently, a configuration of each pixel area PIX in the active matrix substrate 1000 is described.

Figure 15A:
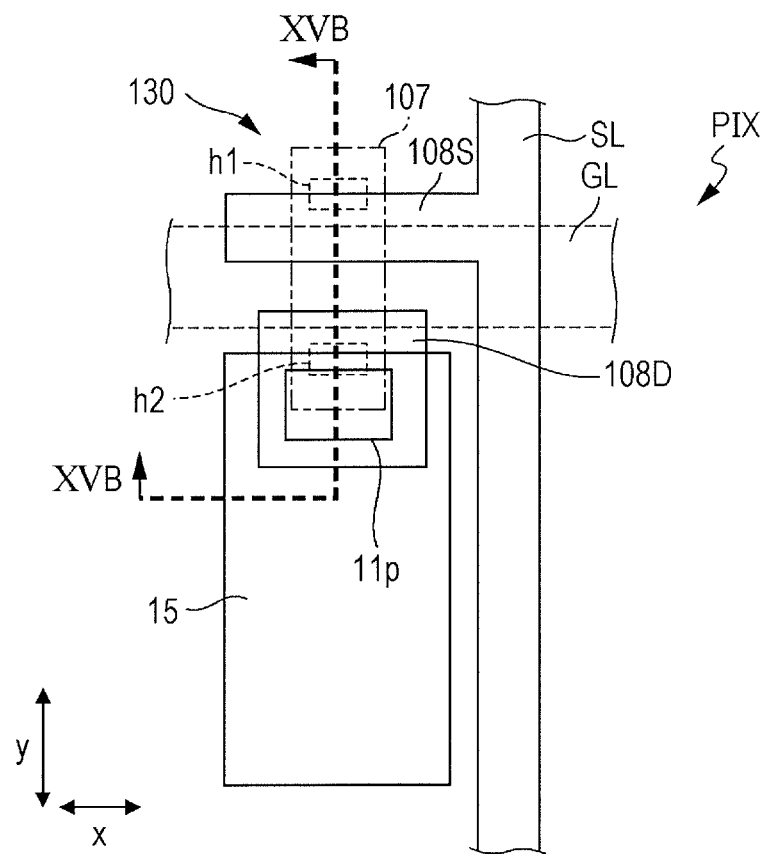
FIGS. 15A and 15B are a plan view of a pixel area in the active matrix substrate, and a cross-sectional view taken along line XVB-XVB, respectively.
Figure 15B:
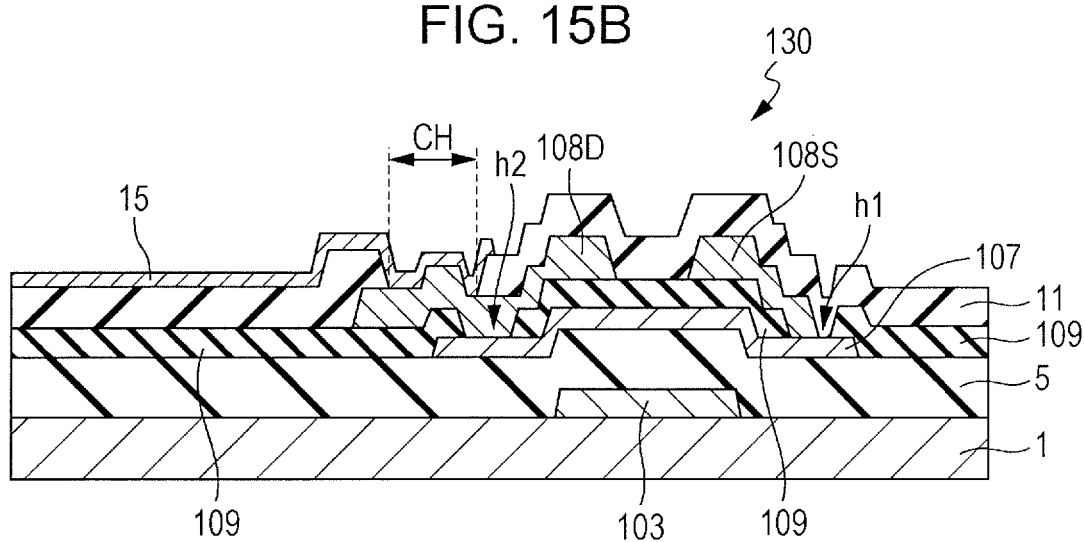

FIGS. 15A and 15B are a plan view of one pixel area PIX in the active matrix substrate, and a cross-sectional view taken along line XVB-XVB, respectively.

The pixel area PIX is an area that is surrounded with the source bus line SL that extends in the y direction, and the gate bus line GL that extends in the x direction that intersects the source bus line SL. The pixel area PIX has the substrate 1, a TFT (hereinafter referred to as "pixel TFT") 130 that is supported on the substrate 1, and a pixel electrode 15. The pixel TFT 130, for example, is an oxide semiconductor TFT that has the bottom gate structure.

Although not illustrated, the active matrix substrate 1000 may further have a common electrode. The common electrode may be positioned in such a manner as to face the pixel electrode with a dielectric layer in between. This active matrix substrate, for example, can find application in the display device that operates in an FFS mode.

Subsequently, a structure of the pixel TFT 130 is in more detail described.

The pixel TFT 130 has a gate electrode (a front gate electrode) 103 that is supported in the substrate 1, the gate insulation layer 5 that covers the gate electrode 103, the oxide semiconductor layer 107 that is formed on the gate insulation layer 5, and the source electrode 108S and the drain electrode 108D that are arranged in such a manner as to be brought into contact with the oxide semiconductor layer 107 are included. The oxide semiconductor layer 107 is covered with a channel protection layer 109. The channel protection layer 109 has opening portions h1 and h2 through which a source contact area and a drain contact area, respectively, of the oxide semiconductor layer 107 are to be exposed. Each of the source electrode 108S and the drain electrode 108D is brought into contact with an upper surface of the oxide semiconductor layer 107 within the opening portions h1 and h2.

The channel protection layer 109 may be formed from the same insulation film as the channel protection layer 9 of the DMX circuit TFT 30 (FIGS. 3A and 3B). Furthermore, as described above, the channel protection layer 109 may be thinner than the channel protection layer 9 of the DMX circuit TFT 30. Accordingly, it is possible that the self-alignment process described above is used only for manufacturing the DMX circuit TFT 30.

The gate electrode 103 is connected to the corresponding gate bus line GL, and the source electrode 108S is connected to the corresponding source bus line SL. The drain electrode 108D is electrically connected to the pixel electrode PE. The gate electrode 103 and the gate bus line GL may be integrally formed within the gate metal layer. The source electrode 108S and the source bus line SL may be integrally formed within the source metal layer.

The pixel TFT 130 is covered with the protection layer (for example, the inorganic insulation layer) 11. A pixel electrode 15 is positioned on the inorganic insulation layer 11. The pixel electrode 15 is brought into contact with the drain electrode 8D within an opening portion CH that is formed in the inorganic insulation layer 11.

Oxide Semiconductor

The oxide semiconductor that is included in the oxide semiconductor layers may be an amorphous oxide semiconductor and may be a crystalline oxide semiconductor that has a crystalline portion. As the crystalline oxide semiconductor, a polycrystalline oxide semiconductor, a microcrystalline oxide semiconductor, a crystalline oxide semiconductor in which a c-axis aligns roughly vertically with a layer surface, or the like is given.

The oxide semiconductor layer may have a two- or greater-layered structure. In a case where the oxide semiconductor layer has a multi-layered structure, the oxide semiconductor layer may include a non-crystalline oxide semiconductor layer and a crystalline oxide semiconductor layer. Alternatively, the oxide semiconductor layer may include multiple crystalline oxide semiconductor layers that have different crystal structures. Furthermore, the oxide semiconductor layer may include multiple non-crystalline oxide semiconductor layers. In a case where the oxide semiconductor layer has a two-layered structure in which an upper layer and a lower layer are included, it is preferable that an energy gap of an oxide semiconductor that is contained in the upper layer is set to be greater than an energy gap of an oxide semiconductor that is contained in the lower layer. However, in a case where a difference in the energy gap between the upper and lower layers is comparatively small, the energy gap of the oxide semiconductor in the lower layer may be set to be greater than the energy gap of the oxide semiconductor in the upper layer.

Materials and structures of the non-crystalline oxide semiconductor and each of the crystalline oxide semiconductors described above, a film formation method, a structure of the oxide semiconductor that has a multi-layered structure, and the like, for example, are described in Japanese Unexamined Patent Application Publication No. 2014-007399. For reference, the entire contents of Japanese Unexamined Patent Application Publication No. 2014-007399 are incorporated in the present specification by reference.

The oxide semiconductor layer, for example, may include at least one type of metal element among In, Ga, and Zn. In the present embodiment, the oxide semiconductor layer, for example, contains an In—Ga—Zn—O-based semiconductor (for example, oxide indium gallium zinc). The In—Ga—Zn—O-based semiconductor here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. This oxide semiconductor layer can be formed from an oxide semiconductor layer that contains an In—Ga—Zn—O-based semiconductor.

The In—Ga—Zn—O-based semiconductor may be amorphous and may be crystalline. A crystalline in-Ga—Zn—O-based semiconductor in which a c-axis aligns roughly vertically with a layer surface is preferable as a crystalline In—Ga—Zn—O-based semiconductor.

It is noted that a crystal structure of the crystalline In—Ga—Zn—O-based semiconductor, for example, is disclosed in Japanese Unexamined Patent Application Publication Nos. 2014-007399, 2012-134475, and 2014-209727, which are described above, and other publications. For reference, the entire contents of Japanese Unexamined Patent Application Publication Nos. 2012-134475 and 2014-209727 are incorporated in the present specification by reference. A TFT that has an In-GA-Zn—O-based semiconductor layer has high mobility (which is more than 20 times higher than that of an a-Si TFT) and a small amount of leak current (which is less than one-hundredth of that of the a-Si TFT). Because of this, the TFT is suitably used as a drive TFT (for example, a TFT that is included in a drive circuit which is provided on the same substrate as a display area, in the vicinity of the display area that includes multiple pixels) and a pixel TFT (a TFT that is provided in a pixel).

The oxide semiconductor layer may contain any other oxide semiconductor instead of the In—Ga—Zn—O-based semiconductor. For example, an In—Sn—Zn—O-based semiconductor (for example, $In_2O_3$—$SnO_2$—ZnO; InSn-ZnO) may be contained. The In—Sn—Zn—O-based semiconductor is a ternary oxide material that consists of Indium (In), Tin (Sn), and Zinc (Zn). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, Cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, or the like.

The embodiments according to the present disclosure can suitably find application in an active matrix substrate that has a peripheral circuit which is monolithically formed. This active matrix substrate finds application in display devices, such as liquid crystal display devices, organic electroluminescence (EL) display devices, and inorganic electroluminescence display devices, imaging devices such as image sensor devices, and various electronic devices, such as image input devices, fingerprint reading devices, and semiconductor memories.

The present disclosure contains subject matter related to that disclosed in Japanese Priority Patent Application JP 2018-037154 filed in the Japan Patent Office on Mar. 2, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An active matrix substrate comprising:
a display area including multiple pixels;
a non-display area provided in a vicinity of the display area;
a substrate;
a demultiplexer circuit positioned on the non-display area and supported on the substrate;
multiple source bus lines extending in a first direction in the display area; and
multiple gate bus lines extending in a second direction that intersects the first direction, in the display area,
wherein the demultiplexer circuit includes multiple TFTs and is connected to the multiple source bus lines,
wherein each of the multiple TFTs includes
a gate electrode,
an oxide semiconductor layer positioned in such a manner as to face the gate electrode with a gate insulation layer in between, the oxide semiconductor layer including a source contact area, a drain contact area, and an area between a source and a drain, which is positioned between the source contact area and the drain contact area and includes a channel region,
a channel protection layer that covers only a portion of the area between the source and the drain, of the oxide semiconductor layer,
a source electrode that is brought into contact with the source contact area of the oxide semiconductor layer, and
a drain electrode that is brought into contact with the drain contact area of the oxide semiconductor layer, and
wherein, at a certain cross-section in a channel length direction, of each of the multiple TFTs, an end portion facing toward the channel region, of one electrode of the source electrode and the drain electrode is brought into contact with the channel protection layer, and an end portion facing toward the channel region, of another electrode is positioned at a distance away from the channel protection layer.

2. The active matrix substrate according to claim 1, wherein, at another certain cross-section in the channel length direction, of each of the multiple TFT, an end portion facing toward the channel region, of the other electrode of the source electrode and the drain electrode is brought into contact with the channel protection layer, and an end portion facing toward the channel region, of the one electrode is positioned at a distance away from the channel protection layer.

3. The active matrix substrate according to claim 1, wherein a thickness of the channel protection layer is equal to or greater than half of a thickness of each of the source electrode and the drain electrode.

4. The active matrix substrate according to claim 1, wherein the channel protection layer is thicker than the source electrode and the drain electrode.

5. The active matrix substrate according to claim 1, wherein, at the certain cross-section in the channel length direction, of each of the multiple TFTs, the one electrode is brought into contact with a flank surface of the channel protection layer and is not brought into contact with an upper surface thereof.

6. The active matrix substrate according to claim 1, wherein each of the multiple TFTs is positioned in such a manner that a channel width direction is the first direction and that the channel length direction is the second direction.

7. The active matrix substrate according to claim 1, wherein an edge portion facing toward the channel region, of the one electrode has a recessed portion along a flank surface of the channel protection layer when viewed from a direction normal to the substrate.

8. The active matrix substrate according to claim 1, wherein, when viewed from a direction normal to the substrate, the channel protection layer extends in a third direction that intersects the channel length direction and a channel width direction, one end portion in the third direction, of the channel protection layer is brought into contact with the source electrode, and another end portion is brought into contact with the drain electrode.

9. The active matrix substrate according to claim 1, wherein the gate electrode is positioned between the substrate and the oxide semiconductor layer.

10. The active matrix substrate according to claim 9, wherein each of the multiple TFTs further includes another gate electrode positioned on a side opposite to the substrate, of the oxide semiconductor layer.

11. The active matrix substrate according to claim 1, wherein the gate electrode is positioned on a side opposite to the substrate, of the oxide semiconductor layer.

12. The active matrix substrate according to claim 1, wherein a portion that is not covered with the channel protection layer, of the area between the source and the drain, of the oxide semiconductor layer is a low-resistance area that has a lower electric resistance than a portion that is covered with the channel protection layer.

13. The active matrix substrate according to claim 1, further comprising:
a pixel TFT that is positioned in each of the multiple pixels,
wherein the pixel TFT is an etch stop type TFT including
a pixel oxide semiconductor layer, and
a pixel channel protection layer that covers a channel region of the pixel oxide semiconductor layer, and
wherein a thickness of the pixel channel protection layer is smaller than a thickness of the channel protection layer in each of the multiple TFTs.

14. The active matrix substrate according to claim 1, wherein the oxide semiconductor layer contains an In—Ga—Zn—O-based semiconductor.

15. The active matrix substrate according to claim 14, wherein the In—Ga—Zn—O-based semiconductor contains a crystalline portion.

16. The active matrix substrate according to claim 1, wherein the demultiplexer circuit has multiple unit circuits each of which distributes a video signal from one video signal line, among multiple video signal lines, to n (n is an integer that is equal to or greater than 2) source bus lines, among multiple source bus lines,
wherein each of the multiple unit circuits has at least n TFTs and n branch wiring lines connected to the one video signal line, drain electrodes of the at least n TFTs are electrically connected to one of the n source bus lines, and source electrodes of the at least n TFTs are electrically connected to one of the n branch wiring lines, and
wherein the multiple TFTs includes the at least n TFTs.

17. A method of manufacturing the active matrix substrate according to claim 1, the method comprising:
forming the oxide semiconductor layer, and the channel protection layer that covers a portion of the oxide semiconductor layer;
forming a conductive film that covers the oxide semiconductor layer and the channel protection layer, the conductive film having a projecting portion that reflects a shape of the channel protection layer;
forming a mask on the conductive film; and
obtaining the source electrode and the drain electrode by performing etching of the conductive film using the mask,
wherein the forming of the mask on the conductive film includes
forming a resist film on the conductive film, a portion that is positioned on the projecting portion of the conductive film, of the resist film being thinner than any other portions, and
obtaining the mask having an opening portion, by exposing the resist film using a photomask, subsequently performing development, and removing a portion that is defined by the photomask, of the resist film, the mask for aligning a portion of a contour of the opening portion to an edge portion of the channel protection layer when viewed from a direction normal to the substrate being formed by also removing a portion that is not defined by the photomask, of a portion that is positioned on the projecting portion of the resist film.

18. A demultiplexer circuit comprising multiple TFTs, wherein each of the multiple TFTs includes
a gate electrode,
an oxide semiconductor layer positioned in such a manner as to face the gate electrode with a gate insulation layer in between, the oxide semiconductor layer including a source contact area, a drain contact area, and an area between a source and a drain, which is positioned between the source contact area and the drain contact area and includes a channel region,
a channel protection layer that covers only a portion of the area between the source and the drain, of the oxide semiconductor layer,
a source electrode that is brought into contact with the source contact area of the oxide semiconductor layer, and
a drain electrode that is brought into contact with the drain contact area of the oxide semiconductor layer, and
wherein, at a certain cross-section in a channel length direction, of each of the multiple TFTs, an end portion facing toward the channel region, of one electrode of the source electrode and the drain electrode is brought into contact with the channel protection layer, and an end portion facing toward the channel region, of another electrode is positioned at a distance away from the channel protection layer.

* * * * *